(12) United States Patent
Yu et al.

(10) Patent No.: US 11,507,811 B2
(45) Date of Patent: Nov. 22, 2022

(54) ELECTRONIC DEVICE FOR ENCODING EVENT INDICATED BY SPATIAL-TEMPORAL INPUT SIGNALS AND OPERATING METHOD THEREOF

(71) Applicant: ELECTRONICS AND TELECOMMUNICATIONS RESEARCH INSTITUTE, Daejeon (KR)

(72) Inventors: Hyun Kyu Yu, Daejeon (KR); Young-Su Kwon, Daejeon (KR); Joo Hyun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 366 days.

(21) Appl. No.: 16/813,901

(22) Filed: Mar. 10, 2020

(65) Prior Publication Data
US 2020/0302279 A1    Sep. 24, 2020

(30) Foreign Application Priority Data

Mar. 19, 2019    (KR) .................. 10-2019-0031484

(51) Int. Cl.
| | | |
|---|---|---|
| *G06N 3/063* | (2006.01) | |
| *G06N 3/04* | (2006.01) | |
| *G11C 7/10* | (2006.01) | |

(52) U.S. Cl.
CPC ............. *G06N 3/063* (2013.01); *G06N 3/049* (2013.01); *G11C 7/1096* (2013.01)

(58) Field of Classification Search
CPC ...... G06N 3/063; G06N 3/049; G11C 7/1096; G11C 7/1006; G11C 8/10; G11C 8/18; G11C 11/54
See application file for complete search history.

(56) References Cited

U.S. PATENT DOCUMENTS

| | | | |
|---|---|---|---|
| 9,147,155 B2 | 9/2015 | Chan et al. | |
| 9,311,594 B1* | 4/2016 | Fisher | ................... G06N 3/049 |
| 9,715,653 B2 | 7/2017 | Modha | |
| 11,157,804 B2* | 10/2021 | Tschirhart | .............. G06N 3/061 |
| 2017/0200079 A1 | 7/2017 | Amir et al. | |
| 2017/0286828 A1 | 10/2017 | Smith | |

(Continued)

FOREIGN PATENT DOCUMENTS

WO    2013/025708 A2    2/2013

OTHER PUBLICATIONS

DiLorenzo, Patricia M., et al., "Spike Timing Mechanisms and Function", CRC Press, 2013.
(Continued)

*Primary Examiner* — Ajay Ojha
(74) *Attorney, Agent, or Firm* — Rabin & Berdo, P.C.

(57) ABSTRACT

An electronic device includes first to n-th cells ('n' is an integer of 2 or more) that receive spatial-temporal input signals that indicate an event unit in a time window, a summation circuit that sums first to n-th cell signals recorded in the first to n-th cells for each of first to m-th unit times ('m' is an integer of 2 or more) dividing the time window to generate first to m-th summation signals, and an encoding circuit that compares each of the first to m-th summation signals with a threshold value to encode the spatial-temporal input signals into a code of the event unit.

18 Claims, 17 Drawing Sheets

(56) References Cited

U.S. PATENT DOCUMENTS

2018/0005108 A1\*  1/2018  Cruz-Albrecht ........ G06F 7/523
2018/0225563 A1   8/2018  Kim et al.
2018/0232635 A1   8/2018  Oh et al.

OTHER PUBLICATIONS

Nadasdy, Zoltan, "Spike sequences and their consequences", Journal of Physiology, vol. 94, pp. 505-524, 2000.
Smith, James E., "Space-Time Computing with Temporal Neural Networks", Morgan & Claypool Publishers, 2017.

\* cited by examiner

ELECTRONIC DEVICE FOR ENCODING EVENT INDICATED BY SPATIAL-TEMPORAL INPUT SIGNALS AND OPERATING METHOD THEREOF

CROSS-REFERENCE TO RELATED APPLICATIONS

This U.S. non-provisional patent application claims priority under 35 U.S.C. § 119 to Korean Patent Application No. 10-2019-0031484, filed on Mar. 19, 2019, in Korean Intellectual Property Office, the entire contents of which are incorporated herein by reference.

BACKGROUND

Embodiments relate to an electronic device for encoding an event indicated by spatial-temporal input signals and a method of operating the same.

A neuron constructing a neural network may receive signals from neighboring neurons. The neuron may fire when a magnitude of an accumulative signal by the received signals exceeds a certain level, and may transmit a new spike signal to other neurons.

Method for modeling a spike signal that is output from the neuron, may be largely divided into a method of modeling a precise formation process and a shape for the spike signal, using an electrical circuit, and a method of encoding an array of spike signals obtained by simplifying whether the spike signal is generated to logic values (e.g., 0 or 1) of one signal. In the latter case, the array of the spike signals may include both information related to spaces of neurons generating the spike signals and information related to time indicating whether the spike signals is generated in the neurons. It is necessary to correctly encode the spike signals with spatial-temporal information.

SUMMARY

The inventive concept are to solve the above technical problem, and embodiments of the inventive concept provide an electronic device capable of encoding an event indicated by spatial-temporal input signals and a method of operating the same An electronic device according to an embodiment of the inventive concept may include first to n-th cells ('n' is an integer of 2 or more) that receive spatial-temporal input signals that indicate an event unit in a time window, a summation circuit that sums first to n-th cell signals recorded in the first to n-th cells for each of first to m-th unit times ('m' is an integer of 2 or more) dividing the time window to generate first to m-th summation signals, and an encoding circuit that compares each of the first to m-th summation signals with a threshold value to encode the spatial-temporal input signals into a code of the event unit.

A method of operating an electronic device that encodes an event object indicated by spatial-temporal input signals according to another embodiment of the inventive concept may include dividing the event object into first to k-th event units based on first to k-th time windows ('k' is an integer of 2 or more), generating first to m-th summation signals of each of the first to k-th event units by summing first to n-th cell signals recorded in first to n-th cells ('n' is an integer of 2 or more) that receive the spatial-temporal input signals for each of first to m-th unit times ('m' is an integer of 2 or more) dividing each of the first to k-th time windows, encoding the spatial-temporal input signals into first to k-th codes of the first to k-th event units by comparing each of the first to m-th summation signals with a threshold value, and storing the first to k-th codes in a memory cell array.

BRIEF DESCRIPTION OF THE FIGURES

Features will become apparent to those of skill in the art by describing in detail exemplary embodiments with reference to the attached drawings in which.

DETAILED DESCRIPTION

Embodiments of the inventive concept will be described below clearly and in detail such that those skilled in the art may easily practice the inventive concept.

Figure 1:
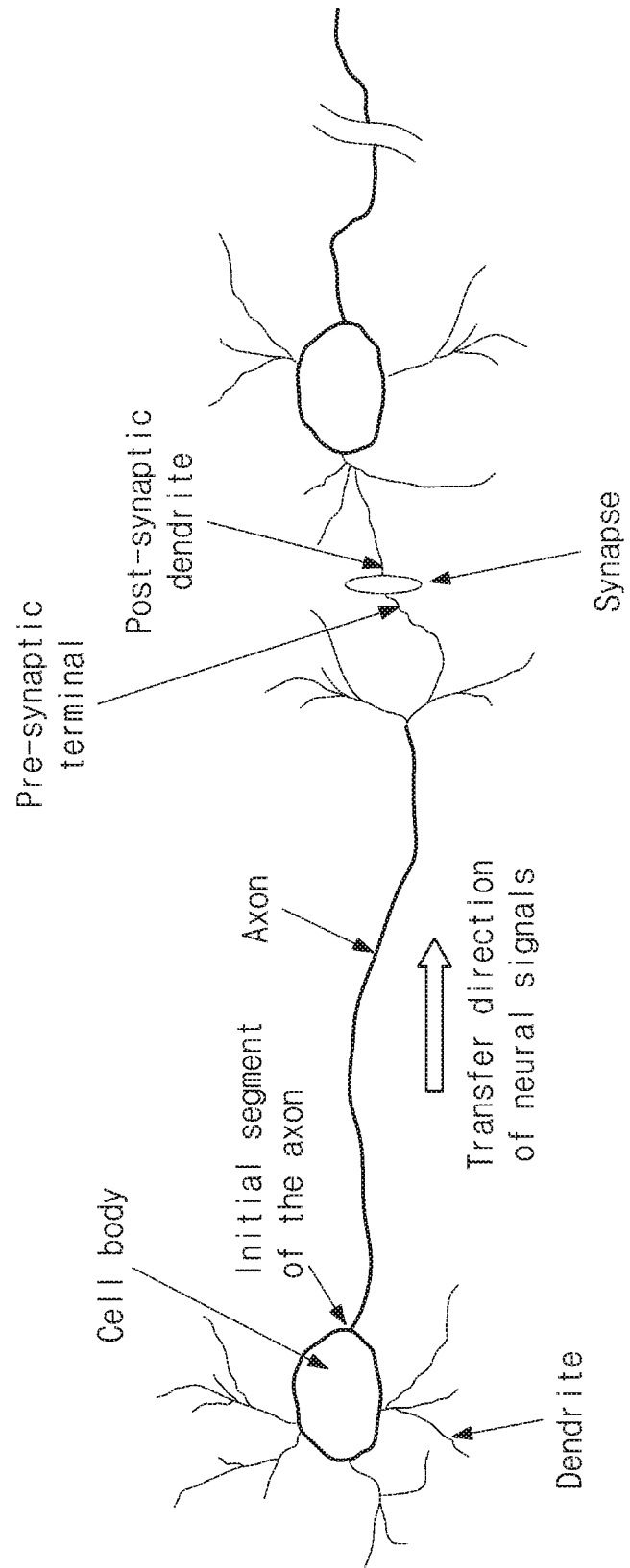
FIG. 1 illustrates a neural network including neurons.

FIG. 1 is a diagram illustrating a neural network including neurons. Referring to FIG. 1, a neural network may be formed by connecting a plurality of neurons to each other. A neuron may transfer information to another neuron in a form of electrical signal. The neuron may include a cell body, a dendrite, and an axon. The dendrite may receive an electrical or chemical signal from another neuron. The axon may has an elongated shape from the cell body, reach nerve endings, and may be used to transfer a neural signal of the neuron. A synapse may have a structure in which the neural signal is transferred from a pre-synaptic terminal to an adjacent neuron through a synaptic cleft having several tens of nm and a post-synaptic dendrite. Neural signals that are transmitted through dendrites formed in various directions may be gathered in the cell body of the adjacent neuron. When the neural signals gathered in the cell body form a potential of a certain magnitude or more, a new spike signal may be output or fired from an initial segment of the axon. The new spike signal may be transmitted to the nerve endings through the axon. An electronic device according to an embodiment of the inventive concept relates to the neural network of FIG. 1 or an artificial neural network that simulates the neural network, and the electronic device may directly communicate with the neural network or may also communicate with other devices that receive and process the neural signals in the neural network.

FIGS. 2A to 2D are diagrams describing methods for encoding spike signals fired in neurons in a time window according to an embodiment of the inventive concept. A spike signal of the neuron may be simply encoded into a first logic value and a second logic value similarly to a bit depending on whether the neuron is fired. For example, the first logic value may be '0' and the second logic value may be '1', but the first logic value may be '1' and the second logic value may be '0'. The first logic value may indicate an equilibrium state of the neuron in which the neuron is not fired, and the second logic value may indicate that the neuron is fired. The spike signal may indicate the neural signal output from the neuron and may include a plurality of pulses that correspond to firing time points of the neuron, respectively. The spike signal may also be referred to as a pulse signal.

Figure 2A:
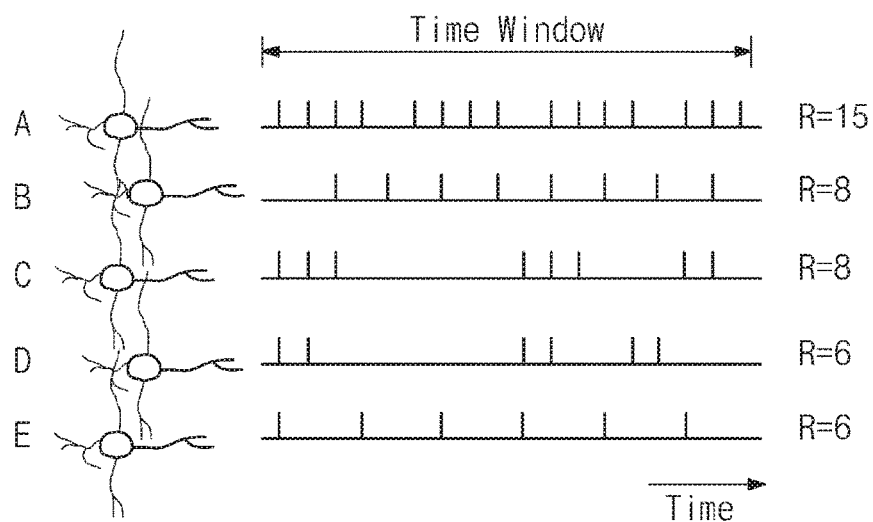
FIGS. 2A to 2D illustrate describing methods for encoding spike signals fired in neurons in a time window according to an embodiment of the inventive concept.

FIG. 2A illustrates a case of encoding a rate (R) or the number of times that neurons A, B, C, D, and E are fired in a time window. The spike signal may include both spatial (location) information indicating which neuron among the neurons A, B, C, D, and E is fired and temporal information indicating a firing time point (where a pulse is located). Referring to FIG. 2A, the rate of the neuron A is 15, the rate of the neuron B is 8, the rate of the neuron C is 8, the rate of the neuron D is 6, and the rate of the neuron E is 6. Pulse arrays of the neurons B and C are different from each other and the temporal information are different from each other, but rates of the neurons B and C are equal to each other as 8. The pulse arrays of the neurons D and E are different from each other and the temporal information are different from each other, but the rates of the neurons D and E are equal to each other as 6.

Figure 2B:
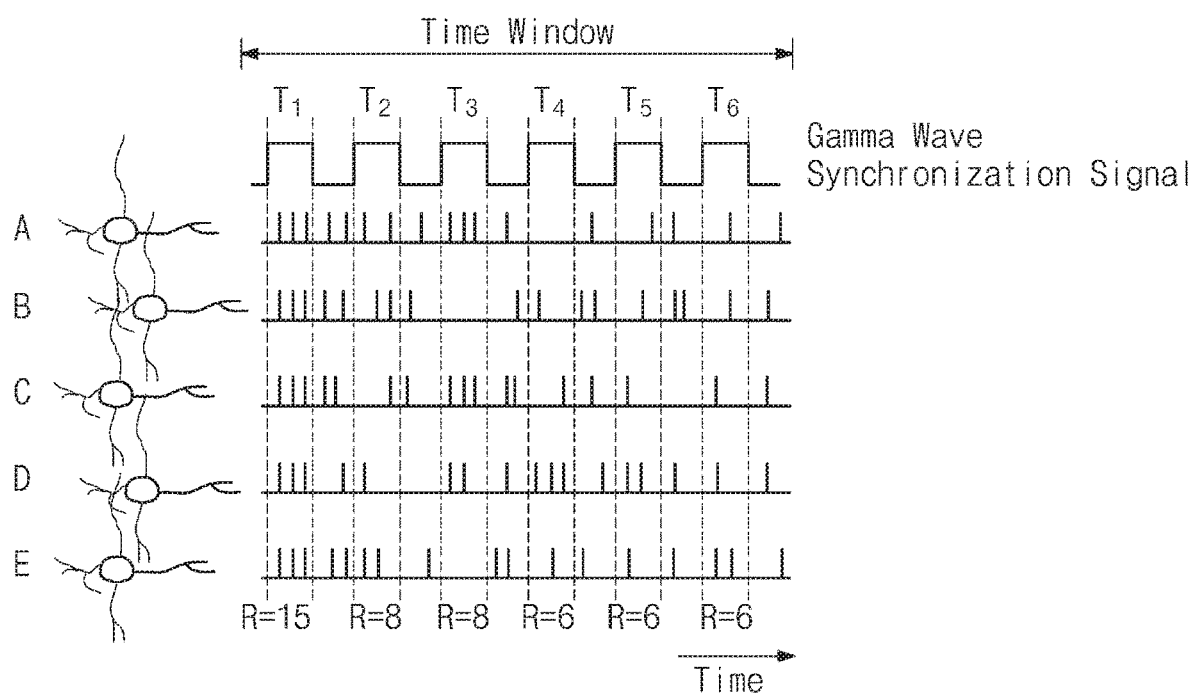

FIG. 2B illustrates a case of encoding the rate or the number of times that the neurons A, B, C, D, and E are fired in intervals (periods, $T_1$, $T_2$, $T_3$, $T_4$, and $T_5$) synchronized with a gamma wave synchronization signal, based on a signal (e.g., the gamma wave synchronization signal) having a uniform period. The pulse arrays of the neurons A, B, E in the interval $T_2$ are different from each other, but the rates of the neurons A, B, E in the interval $T_2$ are equal to each other as 2. The pulse arrays of the neurons A, B, C, D in the interval $T_6$ are different from each other, but the rates of the neurons A, B, C, D in the interval $T_6$ are equal to each other as 1. In addition, referring to FIG. 2B, the rate of all the neurons A, B, C, D, and E in the interval $T_1$ is 15, the rate of all the neurons A, B, C, D, and E in the interval $T_2$ is 8, the rate of all the neurons A, B, C, D, and E in the interval $T_3$ is 8, the rate of all the neurons A, B, C, D, and E in the interval $T_4$ is 6, the rate of all the neurons A, B, C, D, and E in the interval $T_5$ is 6, and the rate of all the neurons A, B, C, D, and E in the interval $T_6$ is 6. The pulse arrays in the intervals $T_2$ and $T_3$ are different from each other, but the rates of the intervals $T_2$ and $T_3$ are equal to each other as 8. The pulse arrays in the intervals $T_4$, $T_5$ and $T_6$ are different from each other but the frequencies of the intervals $T_4$, $T_5$ and $T_6$ are equal to each other as 6.

Figure 2C:
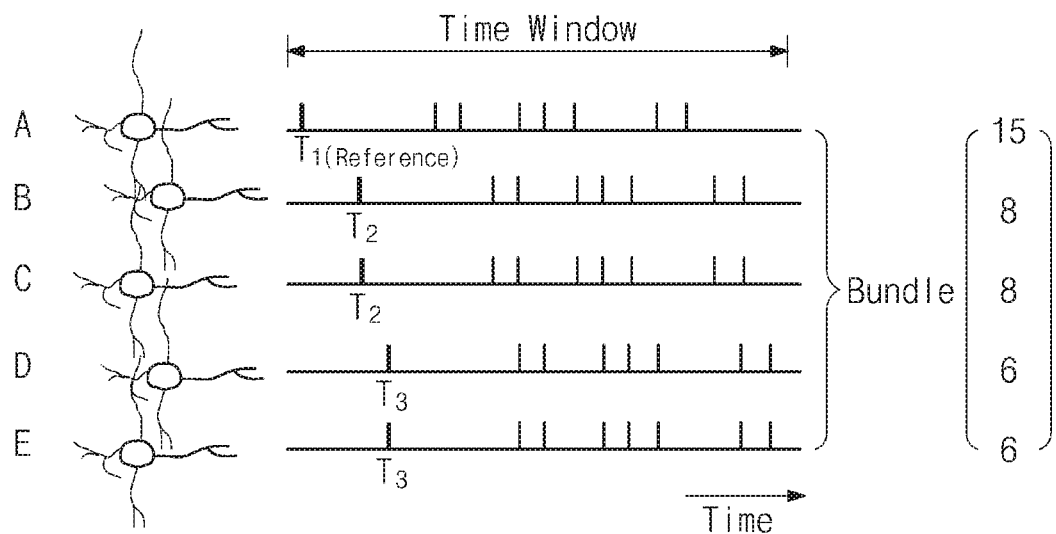
Figure 2D:
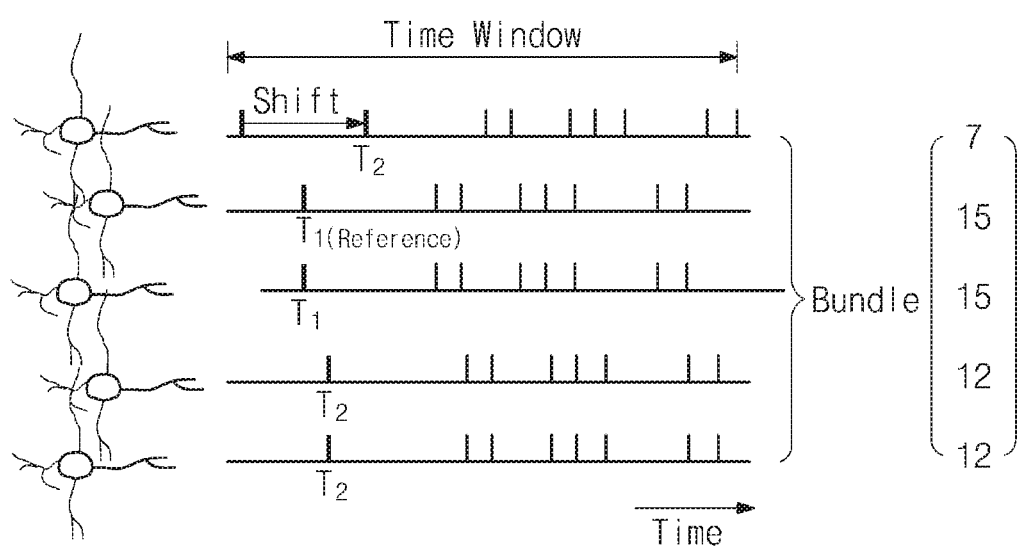

FIGS. 2C and 2D illustrate a case of encoding relative delay times of the spike signals of the neurons, based on the earliest or fastest firing pulse in the time window. A reference pulse of FIG. 2C is a pulse of the neuron A at a time point $T_1$ and a reference pulse of FIG. 2D is a pulse of the neuron B at the time point $T_1$. As the pulse of the neuron A at the time point $T_1$ in FIG. 2C shifts to a time point $T_3$ of FIG. 2D, a code that represent a bundle of the rates at which neurons A, B, C, D, and E are fired may be changed from [15, 8, 8, 6, 6] to [7, 15, 15, 12, 12]. A value of the code may change as the reference pulse changes. In FIGS. 2A to 2D and description thereof, the number of the neurons, the length of the time window, the array of the spike signals, the rate or the number of times that the neurons are fired, the length of the interval, the locations of the time points, the value of the code, etc. as described above are not limited to the above examples.

Figure 3:
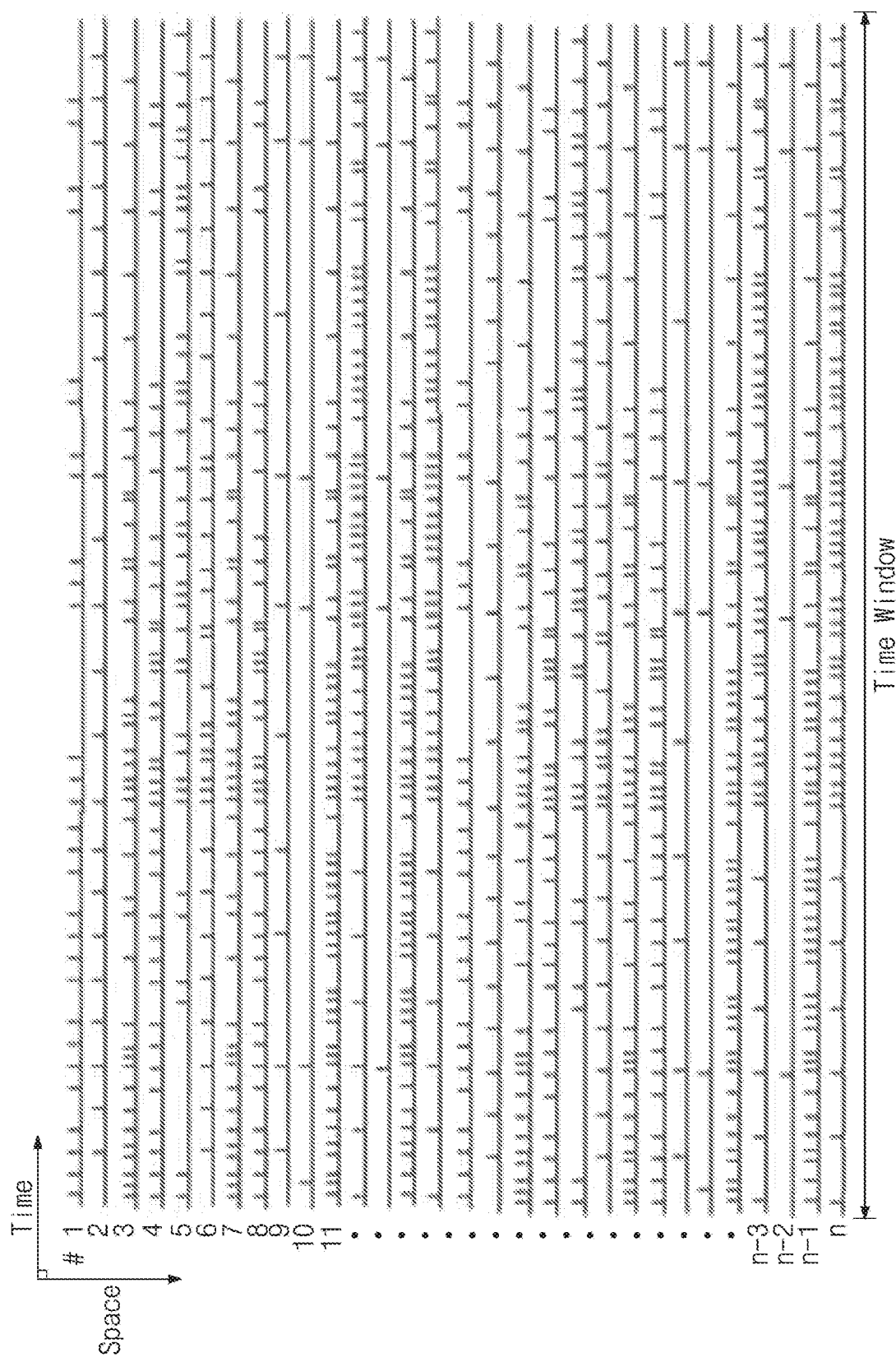
FIG. 3 illustrates spike signals fired from 'n' neurons in a time window.

FIG. 3 is a diagram illustrating spike signals fired from 'n' neurons in a time window. The 'n' is a natural number of 2 or more. A first axis (horizontal axis) may represent a time, and the second axis (vertical axis) may represent a space. The first axis and the second axis may be orthogonal to each other. The array (or pattern) of the spike signals in a two-dimensional space composed of the first axis and the second axis may indicate an event. The array of the spike signals may indicate both the temporal information about the time points at which the spike signals are generated and the spatial information of the neurons generating the spike signals. The array of the spike signals may also be referred to as an array of pulse signals, a pulse train array, etc.

Figure 4:
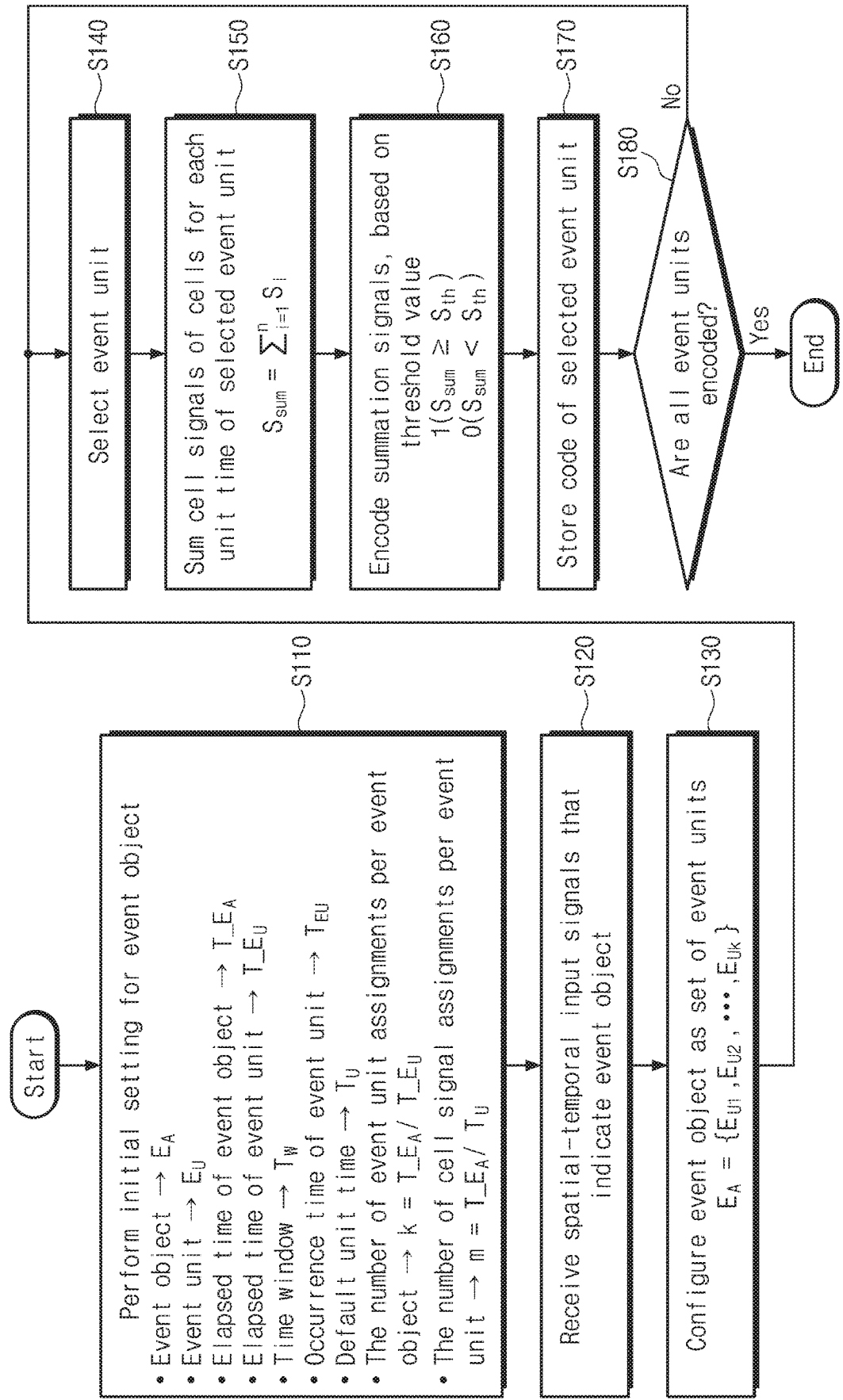
FIG. 4 illustrates a flowchart describing a method of operating an electronic device according to an embodiment of the inventive concept.

FIG. 4 is a flowchart describing a method of operating an electronic device according to an embodiment of the inventive concept. The electronic device may encode the event indicated by the array of the spike signals in consideration of both the temporal information and the spatial information that are included in the array of the spike signals.

In operation S110, the electronic device may perform initial setting for the event object. The electronic device may include a memory that stores a result of the initial setting. The event described above in FIG. 3 may also be referred to as an event object. The electronic device may uniformly divide the event object into a plurality of event units, using the time window that has a predetermined length. The electronic device may uniformly divide each of the plurality of event units, using a default unit time. The electronic device may perform initial setting before performing the above-described division operations. Contents of the initial setting are as follows.

Event Object→$E_A$
Event Unit→$E_U$
Elapsed Time of Event Object→$T\_E_A$
Elapsed Time of Event Unit→$T\_E_U$
Time Window→$T_W$
Occurrence time of Event Unit→$T_{EU}$
Default Unit Time→$T_U$
The Number of Event Unit assignments per Event Object→$k=T\_E_A/T\_E_U$
The Number of Cell Signal assignments per Event Unit→$m=T\_E_U/T_U$ The electronic device may set an elapsed time of event object $T\_E_A$, an elapsed time of event unit $T\_E_U$, and a time window $T_W$ to divide the event object $E_A$ into a plurality of event units $E_U$. For example, the elapsed time of event unit $T\_E_U$ and the time window $T_W$ may be the same ($T\_E_U=T_W$) each other, but the scope of the inventive concept is not limited thereto. When the elapsed time of event object $T\_E_A$ and the elapsed time of event unit $T\_E_U$ are set, the number of event units assigned to one event object may be determined ($k=T\_E_A/T\_E_U$). The 'k' may be an integer of 2 or more. The electronic device may uniformly divide the event object $E_A$ into a plurality of event units $E_U$, using the time window $T_W$ and process the event object $E_A$ in units of the time window $T_W$. The electronic device may set an occurrence time (or the time point; $T_{EU}$) of each event unit. For example, when the event object is divided into first to third event units (k=3), the occurrence times of the first to third event units may be $T_{EU1}$, $T_{EU2}$, and $T_{EU3}$.

The electronic device may process one event unit $E_U$, based on the default unit time ($T_U$; hereinafter referred to as unit time). The electronic device may set the unit time $T_U$ that is less than the time window $T_W$. When the unit time $T_U$ is set, the number of cell signals assigned to one event object may be determined (m=T_$E_U$/$T_U$). The 'm' may be an integer of 2 or more. The cell signal may be stored in a cell included in the electronic device and may have one of the first and second logic values that indicate whether the neuron is fired. For example, the cell may be a memory cell that stores one of the first and second logic values.

The electronic device may receive one or more event objects $E_A$. For example, the electronic device may perform operation S110 only once for all the event objects $E_A$. The result of the initial setting of operation S110 may be common to the event objects $E_A$. For another example, the electronic device may repeatedly perform operation S110 for each event object $E_A$. Results of the initial setting for the event objects $E_A$ may differ from one another.

In operation S120, the electronic device may receive spatial-temporal input signals that indicate the event object $E_A$. The spatial-temporal input signals may indicate signals in which the spike signals are encoded with the first and second logic values, based on whether the neurons of the neural network are fired. For example, the electronic device may directly receive the spatial-temporal input signals. As another example, the electronic device may receive the spike signals of the neural network and convert the received spike signals into the spatial-temporal input signals.

In operation S130, the electronic device may configure the event object $E_A$ as a set of event units $E_U$. Based on the initial setting of the operation S110, the event object $E_A$ may include k event units $E_{U1}$, $E_{U2}$, . . . , $E_{Uk}$. The electronic device may divide the event object $E_A$ into the k event units $E_{U1}$, $E_{U2}$, . . . , $E_{Uk}$, based on k time windows. Operation S110 to operation S130 may correspond to pre-processing of the spatial-temporal input signals by the electronic device.

In operation S140, the electronic device may select the event unit $E_U$. For example, the electronic device may select the k event units $E_{U1}$, $E_{U2}$, . . . , $E_{Uk}$ configured in operation S130 in order, but a selection order is not limited to the above. Thereafter, the electronic device may perform encoding on the selected event unit $E_U$.

In operation S150, the electronic device may sum the cell signals of cells for each unit time $T_U$ of the event unit $E_U$ selected in operation S140. The number of unit times $T_U$ assigned per the elapsed time of event unit T_$E_U$ may be 'm'. When the number of cells is 'n', a summation signal may be $S_{sum} = \Sigma_{i=1}^{n} S_i$. The 'n' may be an integer of 2 or more.

In operation S160, the electronic device may encode the summation signals $S_{sum}$ based on a threshold value $S_{th}$. The electronic device may perform encoding based on all-or-none law method comparing the summation signals $S_{sum}$ with the threshold value $S_{th}$. When the summation signal $S_{sum}$ is equal to or greater (or above) than the threshold value $S_{th}$, the electronic device may encode the summation signal $S_{sum}$ into the second logic value. When the summation signal $S_{sum}$ is less (or less than or equal) than the threshold value $S_{th}$, the electronic device may encode the summation signal $S_{sum}$ into the first logic value. The electronic device may set the threshold value $S_{th}$ used in operation S160 in operation S110. The threshold value $S_{th}$ may be variably set or fixed depending on the event object $E_A$, the event unit $E_U$, and the unit time $T_U$.

In operation S170, the electronic device may store the code of the event unit $E_U$ selected in operation S140. The code may be a result of the encoding completed in operation S160. The event unit $E_U$ is a segmentation of the event object $E_A$ and, like the event object $E_A$, may include both the temporal information about the time points at which the spike signals are generated and the spatial information of the neurons generating the spike signals. For example, the event unit $E_U$ may have the spatial-temporal information of n×m. As described above, the 'n' may represent the number of cells and the 'm' may represent the number of unit times $T_U$ assigned per the elapsed time of event unit T_$E_U$. The electronic device may encode the event unit $E_U$ having the spatial-temporal information of n×m into the code of 1×m. The electronic device may include a memory for storing the code.

In operation S180, the electronic device may determine whether all event units are encoded. When all event units are not encoded (no), the electronic device may repeatedly perform operations S140 to S180. When all event units are encoded (Yes), the electronic device may complete the encoding of the event object $E_A$ and may receive a new event object $E_A$. The operations S140 to S180 may correspond to encoding the event object $E_A$ and storing the event object $E_A$ by the electronic device.

In an embodiment, an electronic device 100 may be implemented in a hardware manner. The electronic device 100 may be a computing device, a computer, a processor, an integrated circuit, an application specific integrated circuit (ASIC), a field programmable gate array (FPGA), a system on chip (SoC), etc., performing operations S110 to S180. According to another embodiment of the inventive concept, the electronic device 100 may include a non-transitory computer readable medium in which program code in which instructions for performing or executing operations S110 to S180 are recorded is stored, and may also include a processor that loads and executes the program code stored on the non-transitory computer readable medium.

Figure 5:
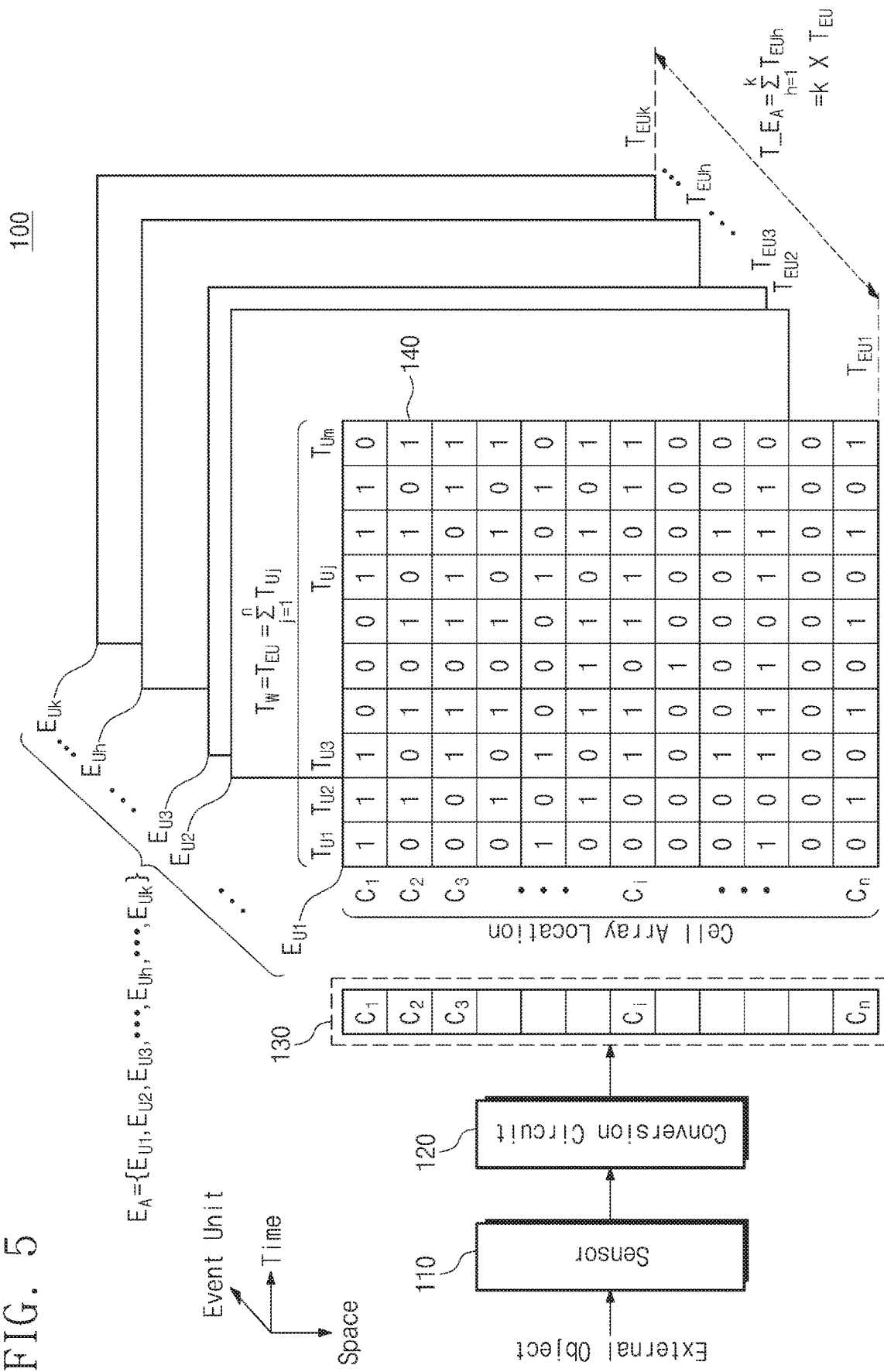
FIG. 5 illustrates an electronic device of FIG. 4 and a three-dimensional memory for encoding and storing an event object.

FIG. 5 is a block diagram illustrating an electronic device of FIG. 4 and a three-dimensional memory for encoding and storing the event object. Referring to FIG. 5, a first axis may represent a space, a second axis may represent a time, and a third axis may represent the event unit $E_U$ in which the event object $E_A$ is divided. For example, the first to third axes may be orthogonal to one another.

The electronic device 100 may include a sensor 110, a conversion circuit 120, and first to n-th cells 130. The sensor 110 may receive and sense the array of the spike signals from an external object (e.g., a neural network, an object, a person, etc.). The conversion circuit 120 may convert the spike signals sensed by the sensor 110 into the spatial-temporal input signals. For example, the conversion circuit 120 may include one or more analog-to-digital converters (ADCs). The conversion circuit 120 may transmit or provide the spatial-temporal input signals to the first to n-th cells. For example, the conversion circuit 120 may assign the spatial-temporal input signals to the first to n-th cells, respectively.

Unlike the illustration of FIG. 5, the electronic device 100 may directly receive the spatial-temporal input signals from an external object. In this case, the electronic device 100 may include a receiving circuit that receives the spatial-temporal input signals instead of the sensor 110 and the conversion circuit 120. The receiving circuit may assign the received spatial-temporal input signals to the first to n-th cells, respectively. For example, each of the spatial-temporal input signals may be a digital signal including a digital bit.

The first to n-th cells 130 may be arranged in a line along the first axis. The first to n-th cells 130 may be referred to as a memory cell array. Each of the first to n-th cells may represent relative spatial information or correlated spatial information instead of absolute spatial information. Each of the first to n-th cells 130 may store a spatial-temporal input signal. For example, when the spatial-temporal input signal is stored in each of the first to n-th cells 130, the cell signal stored in each of the first to n-th cells 130 may have any one of the first and second logic values. For example, each of the first to n-th cells 130 may be a memory cell capable of storing a bit. The memory cell may be a static random access memory (SRAM) cells, a dynamic random access memory (DRAM) cell, a NAND flash memory cell, a NOR flash memory cell, a resistive random access memory (RRAM) cell, a ferroelectric random access memory (FRAM) cell, a phase change random Access Memory (PRAM) cell, a Magnetic Random Access Memory (MRAM) cell, etc.

The electronic device 100 may further include a memory cell array 140 that stores the event object $E_A$ received from the external object. The memory cell array 140 may include memory cells arranged along the first to third axes and may have a three-dimensional structure. The memory cells of the memory cell array 140 may be implemented using any one of the various memory cells described above. The size of the memory cell array 140 may be n×m×k. The memory cell array 140 may include two-dimensional memory cell arrays arranged along the third axis. The two-dimensional memory cell arrays may store the event units $E_U$ dividing the event object $E_A$. The two-dimensional memory cell arrays may be stacked along the third axis. The size of each of the two-dimensional memory cell arrays may be n×m, which is the size of the spatial-temporal information of the event unit $E_U$.

Each of the two-dimensional memory cell arrays may include memory cells arranged along the first axis and the second axis. Referring to FIG. 5, the event object $E_A$ may be divided into the k event units $E_U$ ($E_A = \{E_{U1}, E_{U2}, E_{U3}, \ldots, E_{Uh}, \ldots, E_{Uk}\}$, $T\_E_A = \Sigma_{h=1}^{k} T_{EUk} = k \times T_{gU}$. The time window $T_W$ may be divided into m unit times $T_U$ ($T_W = \Sigma_{j=1}^{m} T_{Uj}$). The first to n-th cells 130 may store the spatial-temporal input signals at the unit time $T_{U1}$ of the event unit $E_{U1}$. Next, the memory cells of the memory cell array 140 that is indicated by spatial addresses $C_1$ to $C_n$ indicating the location of the array of the first to n-th cells 130, a temporal address indicating the unit time $T_{U1}$, and an address indicating the event unit $E_{U1}$, may store the cell signals (i.e., logic values) stored in the first to n-th cells 130. The spatial addresses $C_1$ to $C_n$ may represent the spatial information of the spatial-temporal input signals, and m unit times $T_U$ may represent the temporal information of the spatial-temporal input signals.

The first to n-th cells 130 may store the spatial-temporal input signals at the unit time $T_{U2}$ of the event unit $E_{U1}$ instead of the spatial-temporal input signals at the unit time $T_{U1}$ of the event unit $E_{U1}$. Next, the memory cells of the memory cell array 140 that is indicated by the spatial addresses $C_1$ to $C_n$ indicating the location of the array of the first to n-th cells 130, the temporal address indicating the unit time $T_{U2}$, and the address indicating the event unit $E_{U1}$, may store the cell signals (i.e., logic values) stored in the first to n-th cells 130. The electronic device 100 may divide the event object $E_A$ into event units $E_U$ and unit times $T_U$. The memory cell array 140 may store the event object $E_A$. The logic values stored in the memory cell array 140 are not limited to those illustrated in FIG. 5.

For example, the memory cell array 140 may be implemented physically or in hardware within the electronic device 100 separately from the first to n-th cells 130. The memory cell array 140 may store the event object $E_A$. The first to n-th cells 130 may store the spatial-temporal input signals corresponding to one unit time $T_U$ among the spatial-temporal input signals representing one event unit $E_U$. The first to n-th cells 130 may operate as a buffer memory for the memory cell array 140. As another example, the memory cell array 140 may be a virtual memory representing all of the spatial-temporal input signals that are stored and updated in the first to n-th cells 130.

Figure 6A:
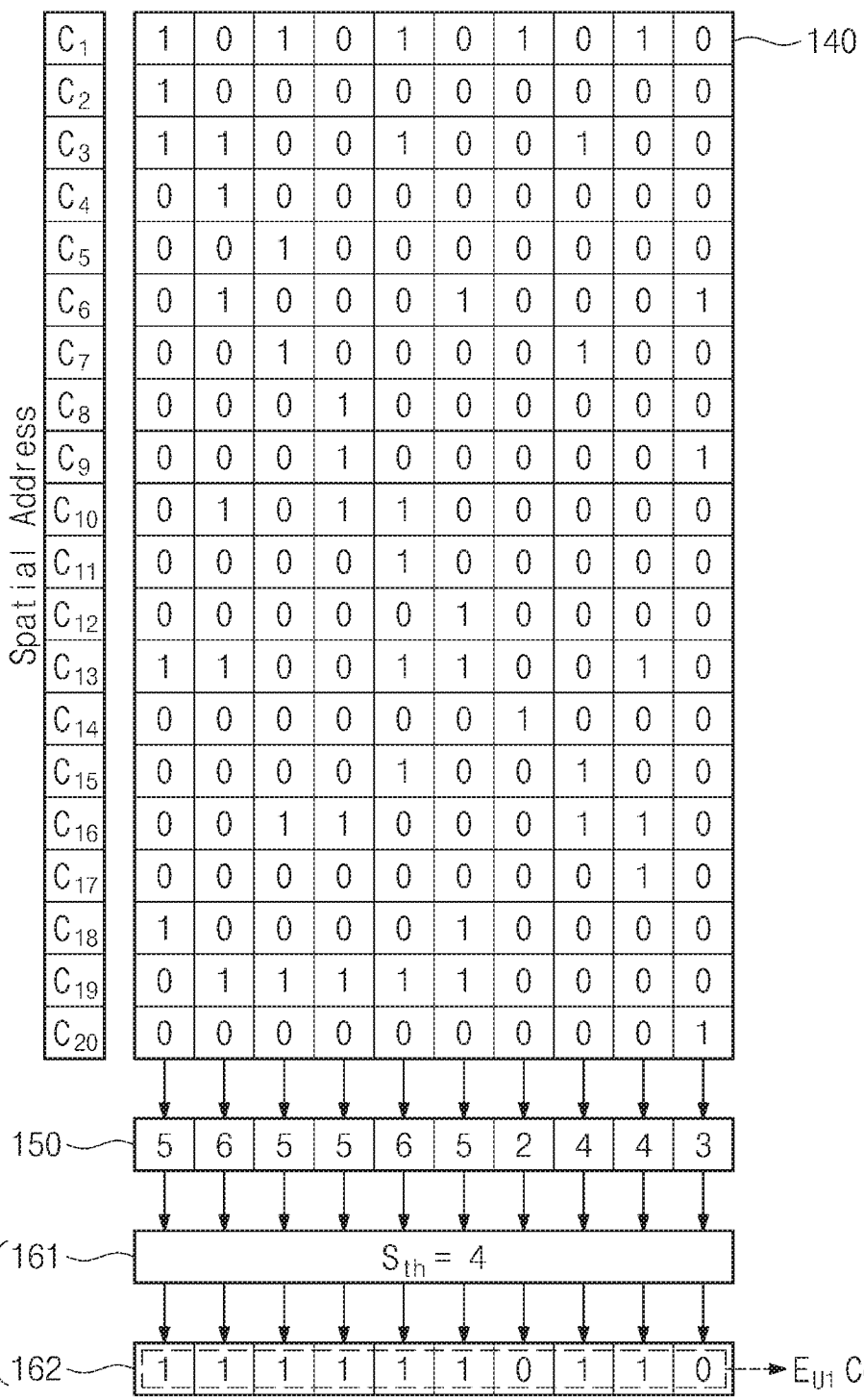
FIGS. 6A and 6B illustrate describing an operation of encoding an event object by an electronic device of FIG. 5.
Figure 6B:
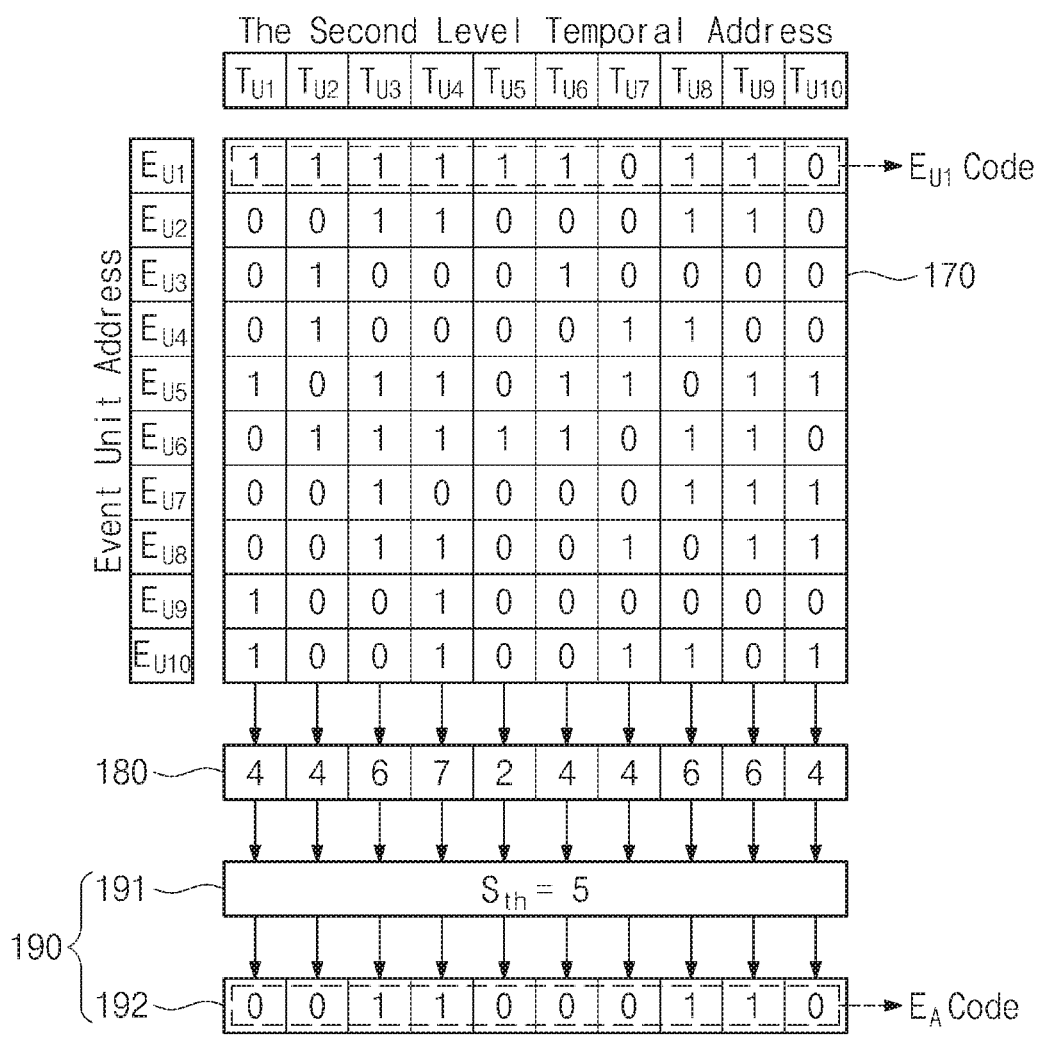

FIGS. 6A and 6B are diagrams describing an operation of encoding an event object by an electronic device of FIG. 5. FIGS. 6A and 6B will be described with reference to FIGS. 4 and 5.

The first to n-th cells 130 of the electronic device 100 may receive and store the spatial-temporal input signals indicating the event unit $E_U$ in the time window $T_W$. The time window $T_W$ may be divided into first to m-th unit times $T_{U1}$ to $T_{Um}$. Referring to FIG. 6A, m is 10 and n is 20. First level temporal addresses are $T_{U1}$ to $T_{U10}$ and the spatial addresses are $C_1$ to $C_{20}$. The two-dimensional 20×10 memory cell array of the memory cell array 140 may sequentially receive and store the cell signals (logic values) corresponding to each of first to ten-th unit times $T_{U1}$ to $T_{U10}$ from the first to twentieth cells 130. The two-dimensional 20×10 memory cell array of the memory cell array 140 may store one event unit $E_U$. The values of m and n described above are all merely exemplary.

The electronic device 100 may further include a summation circuit 150 and an encoding circuit 160. The summation circuit 150 may sum first to twentieth cell signals recorded in the first to twentieth cells 130 for each of the first to ten-th unit times $T_{U1}$ to $T_{Um}$ to generate first to ten-th summation signals (refer to operation S150). More specifically, the summation circuit 150 may include an adder for summing the logic values stored in memory cells, which are indicated by the spatial addresses $C_1$ to $C_{20}$ and the temporal address $T_{U1}$ in the memory cell array 140. The logic values stored in the memory cells, which are indicated by the spatial addresses $C_1$ to $C_{20}$ and the temporal address $T_{U1}$ may be the same as the first to twentieth cell signals recorded in the first to twentieth cells 130. Likewise, the summation circuit 150 may further include another adder for summing the logic values stored in the memory cells, which are indicated by the spatial addresses $C_1$ to $C_{20}$ and the temporal address $T_{U2}$ in the memory cell array 140. The summation circuit 150 may include m adders that sum n logic values.

The encoding circuit 160 may include a filter circuit 161 for storing the threshold value $S_{th}$ and a register circuit 162 for storing the result of encoding. The filter circuit 161 may include a register for storing the threshold value $S_{th}$ and 'm' comparators for comparing the summation signal with the threshold value $S_{th}$ (refer to operation S160). The register circuit 162 may include 'm' registers for receiving and storing 'm' comparison results of the filter circuit 161, respectively (refer to operation S170).

Referring to FIG. 6A, a first summation signal for the logic values stored in the memory cells, which are indicated by the spatial addresses $C_1$ to $C_{20}$ and the temporal address $T_{U1}$ is 5. The filter circuit 161 may compare the first summation signal with the threshold value $S_{th}$ ($S_{th}=4$) and output a comparison result. The comparison result may be the result of the encoding. Since the first summation signal is 5 and the threshold value $S_{th}$ is 4, the encoding circuit 160 may encode the spatial-temporal input signals corresponding to the unit time $T_{U1}$ among the spatial-temporal input signals representing the event unit $E_A$ as the second logic value. The register of the register circuit 162 may store the second logic value as the result of encoding on the unit time $T_{U1}$.

Referring to FIG. 6A, the seven-th summation signal for the logic values stored in the memory cells, which are indicated by the spatial addresses $C_1$ to $C_{20}$ and the temporal address $T_{U7}$ is 2, and the filter circuit 161 may compare the seven-th summation signal with the threshold value $S_{th}$ ($S_{th}=4$) and output a comparison result. Since the seven-th summation signal is 2 and the threshold value $S_{th}$ is 4, the encoding circuit 160 may encode the spatial-temporal input signals corresponding to the unit time $T_{U7}$ among the spatial-temporal input signals representing the event unit $E_A$ as the first logic value. The register of the register circuit 162 may store the first logic value as the result of encoding on the unit time $T_{U7}$. The encoding circuit 160 may similarly perform encoding operations for other unit times $T_{U2}$ to $T_{U6}$ and $T_{U8}$ to $T_{U10}$, as described above. The result of encoding stored in the register circuit 162, that is, the code may have a size of 1×m. Referring to FIG. 6A, the event unit $E_{U1}$ of 20×10 may be simply encoded as a code of 1×10 ({1, 1, 1, 1, 1, 1, 0, 1, 1, 0}). The summation circuit 150 and the encoding circuit 160 may repeatedly perform encoding operations on the other event units $E_{U2}$ to $E_{Uk}$ in the same manner as the above-described the event unit $E_{U1}$. The event units $E_{U1}$ to $E_{Uk}$ may configure one event object $E_A$.

Referring to FIG. 6B, the electronic device 100 may further include a memory cell array 170 for storing a code, as a result of encoding on the event unit $E_U$. The memory cell array 170 may be implemented physically or in hardware within the electronic device 100 separately from the first to n-th cells 130 and the memory cell array 140. The size of the memory cell array 170 may be k×m and may include m×k memory cells arranged in two dimensions. The 'k' may be the number of event units $E_U$ per one event object $E_A$ as described above. Referring to FIG. 6B, m is 10 and k is 10, second level temporal addresses are $T_{U1}$ to $T_{U10}$ and event unit addresses are $E_{U1}$ to $EU_{10}$.

Referring to FIG. 6B, the memory cells that are indicated by the temporal addresses $T_{U1}$ to $T_{U10}$ and the event unit address $E_{U1}$ among the memory cells of the memory cell array 170 may store the code of the event unit $E_{U1}$ under a control of the encoding circuit 160. The memory cells that are indicated by the temporal addresses $T_{U1}$ to $T_{U10}$ and the event unit address $E_{U2}$ among the memory cells of the memory cell array 170 may store the code of the event unit $E_{U2}$, based on the control of the encoding circuit 160. In a similar manner, the code of the event unit $E_U$ may be stored in the memory cell array 170, based on the control of the encoding circuit 160. First to ten-th codes of the ten event units $E_{U1}$ to $EU_{10}$ configuring one event object $E_A$ may be stored in the 10×10 memory cell array 170. Codes of the event units $E_U$ in which one event object $E_A$ is divided may be referred to as a code book.

The electronic device 100 may further include a summation circuit 180 and an encoding circuit 190. The summation circuit 180 may sum the first to ten-th codes for each of the first to ten-th unit times $T_{U1}$ to $T_{U10}$ to generate the first to ten-th summation signals of the event object $E_A$. In more detail, the summation circuit 180 may include an adder for summing the logic values stored in memory cells, which are indicated by the event unit addresses $E_{U1}$ to $E_{U10}$ and the temporal address $T_{U1}$ in the memory cell array 170. The summation circuit 180 may include an adder for summing the logic values stored in memory cells, which are indicated by the event unit addresses $E_{U1}$ to $E_{U10}$ and the temporal address $T_{U2}$ in the memory cell array 170. The summation circuit 180 may include 'm' adders that sum up 'k' logic values. For example, the summation circuit 180 may be implemented separately from the summation circuit 150 of FIG. 6A. For another example, the summation circuit 180 may be integrated into the summation circuit 150 of FIG. 6A and components of the summation circuit 180 may be included in the summation circuit 150 of FIG. 6A.

The encoding circuit 190 may include a filter circuit 191 for storing the threshold value $S_{th}$ and a register circuit 192 for storing the result of encoding. The filter circuit 191 may include a register for storing the threshold value $S_{th}$ and 'm' comparators for comparing the summation signal with the threshold value $S_{th}$. The register circuit 192 may include 'm' registers for receiving and storing 'm' comparison results of the filter circuit 191, respectively. For example, the encoding circuit 190 may be implemented separately from the encoding circuit 160 of FIG. 6A. As another example, the encoding circuit 190 may be integrated into the encoding circuit 160 of FIG. 6A, and components of the encoding circuit 190 may be included in the encoding circuit 160 of FIG. 6A.

Referring to FIG. 6B, the first summation signal for the logic values stored in the memory cells, which are indicated by the event unit addresses $E_{U1}$ to $E_{U10}$ and the temporal address $T_{U1}$ is 4. The filter circuit 191 may compare the first summation signal with the threshold value $S_{th}$ ($S_{th}=5$) and output a comparison result. Since the first summation signal is 4 and the threshold value $S_{th}$ is 5, the encoding circuit 190 may encode the logic values corresponding to the unit time $T_{U1}$ among the logic values representing the event object $E_A$ as the first logic value. The register of the register circuit 192 may store the first logic value as a result of encoding on the unit time $T_{U1}$.

Referring to FIG. 6B, a third summation signal for the logic values stored in the memory cells, which are indicated by the event unit addresses $E_{U1}$ to $E_{U10}$ and the temporal address $T_{U3}$ is 6. The filter circuit 191 may compare the third sum signal with the threshold value $S_{th}$ ($S_{th}=5$) and output a comparison result. Since the third summation signal is 6 and the threshold value $S_{th}$ is 5, the encoding circuit 190 may encode the logic values corresponding to the unit time $T_{U3}$ among the logic values representing the event object $E_A$ as the second logic value. The register of the register circuit 192 may store the second logic value as a result of encoding on the unit time $T_{U3}$. The encoding circuit 190 may also perform the encoding operation for the other unit times $T_{U2}$, and $T_{U4}$ to $T_{U10}$, similarly to the above-described encoding operation. The result of encoding stored in the register circuit 192, that is, the final code may have a size of 1×m. Referring to FIGS. 5, 6A, and 6B, the event object $E_A$ of 20×10×10 (=n×m×k) may be simply encoded as the final code of 1×10 ({0, 0, 1, 1, 0, 0, 0, 1, 1, 0}). The final code of the event object $E_A$ may configure a code library along with other final codes of other event objects. The electronic device 100 may output the logic values stored in the first to n-th cells 130 and the memory cell arrays 140 and 170 to an outside.

Figure 7A:
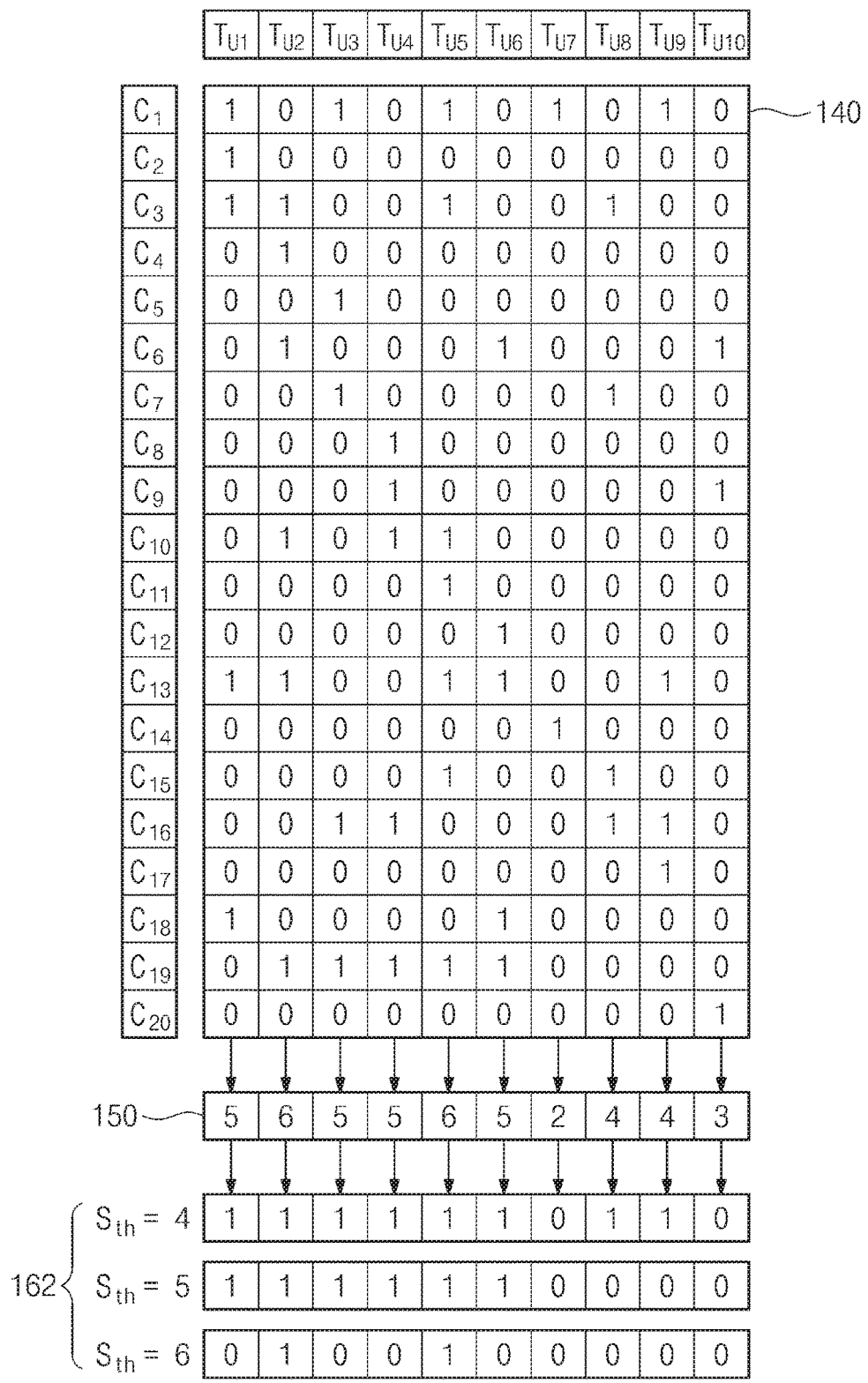
FIGS. 7A to 7C illustrate describing reliability about an error of a cell in an electronic device according to an embodiment of the inventive concept.
Figure 7B:
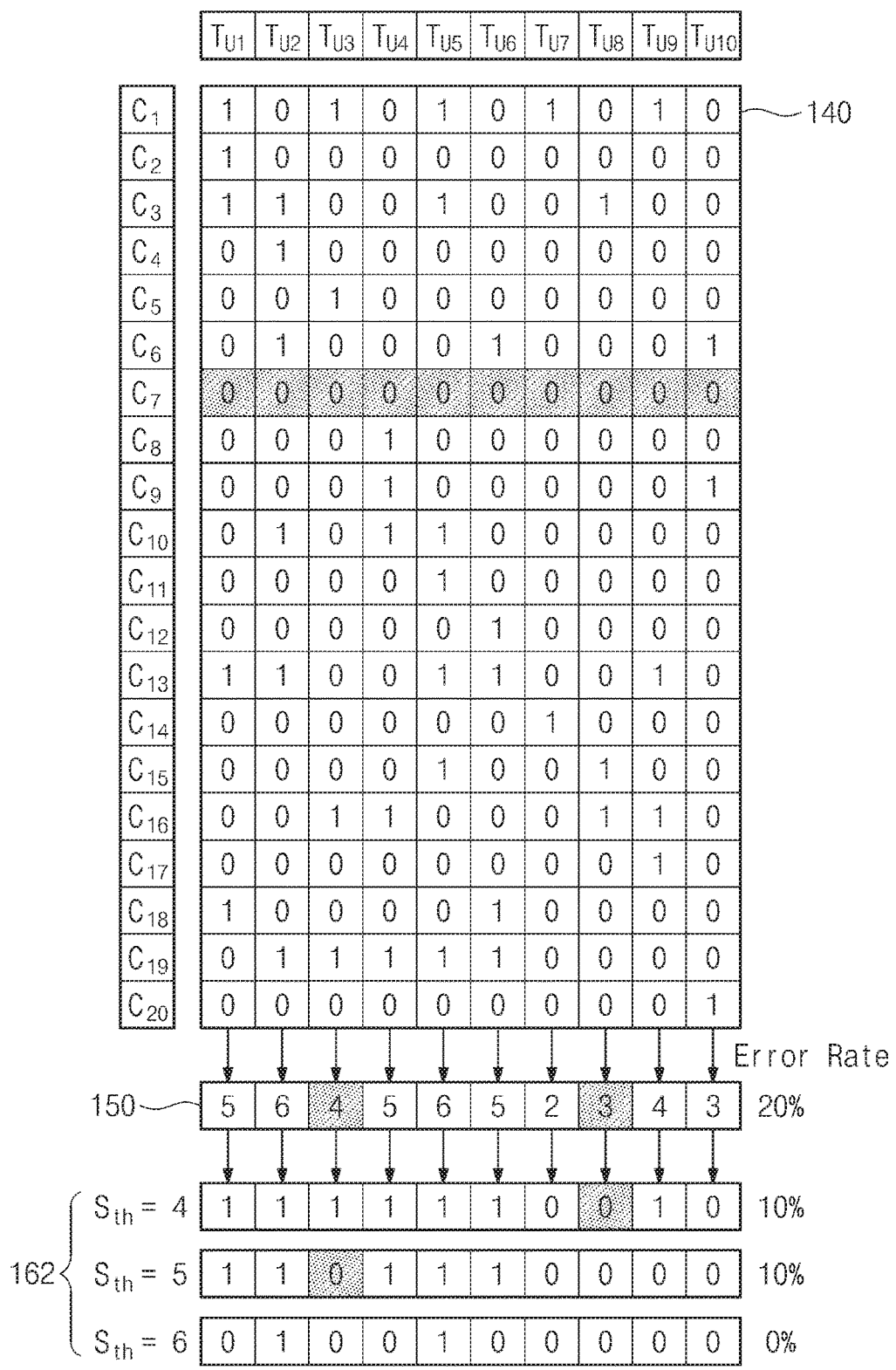
Figure 7C:
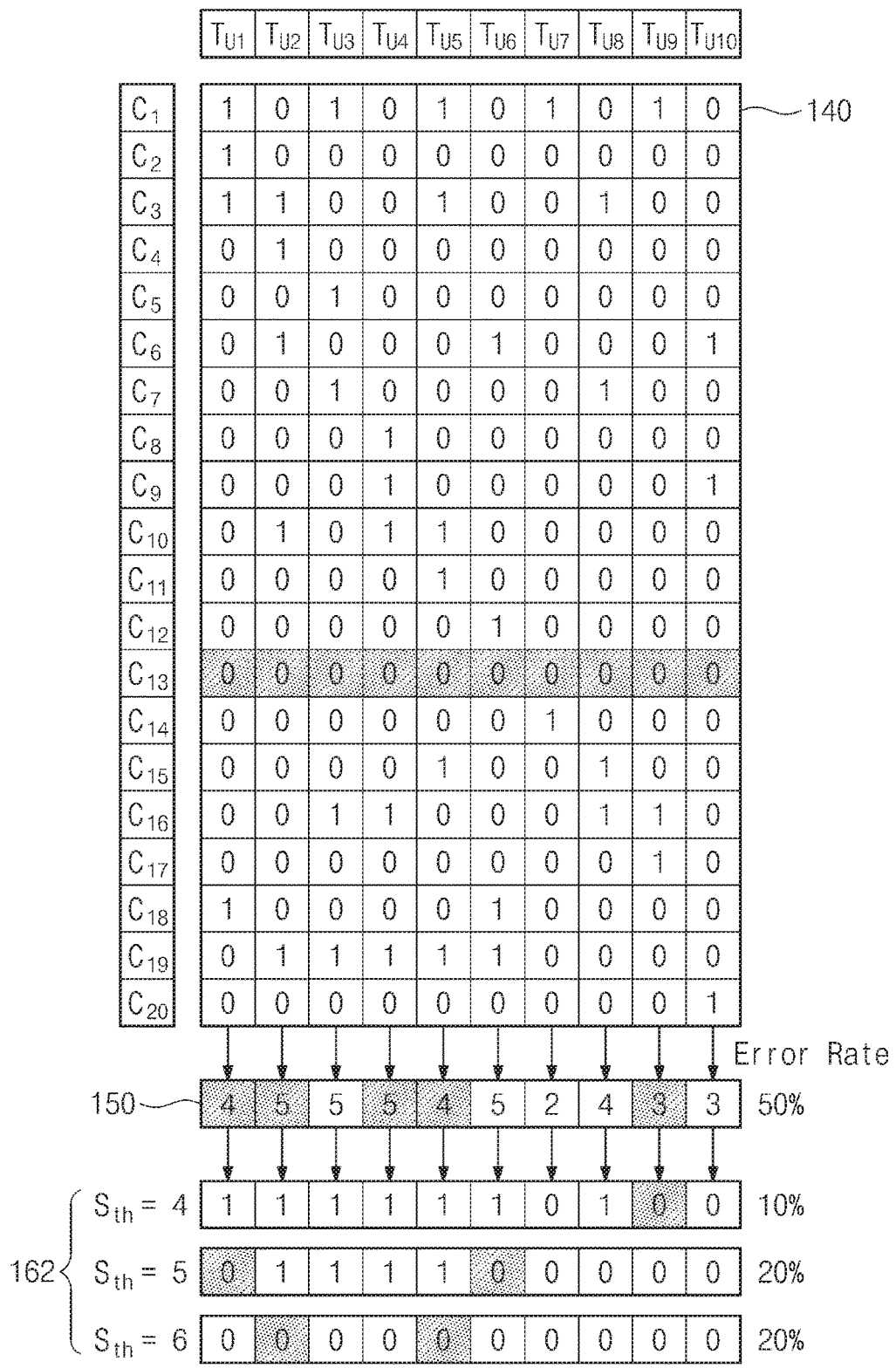

FIGS. 7A to 7C are diagrams describing reliability about an error of a cell in an electronic device according to an embodiment of the inventive concept. FIGS. 7A to 7C will be described with reference to FIGS. 5, 6A, and 6B. Each of FIGS. 7A to 7C illustrates the memory cell array 140, the summation circuit 150, and the register circuit 162 of the encoding circuit 160, in the electronic device 100 in which the spatial-temporal input signals (logic values) representing the event unit $E_{U1}$ are stored. Referring to FIGS. 7A to 7C, the register circuit 162 exemplarily illustrates the codes of the event unit $E_{U1}$ depending on the threshold values $S_{th}$ ($S_{th}$=4, 5 and 6). The code of the event unit $E_{U1}$ may be different depending on the thresholds values $S_{th}$ ($S_{th}$=4, 5 and 6). In FIGS. 7A to 7C, other components of the electronic device 100 are omitted.

FIG. 7A illustrates the memory cell array 140 in which no error occurred. Logic values stored in the memory cell array 140 of FIG. 7A are the same as the logic values stored in the memory cell array 140 of FIG. 6A. FIG. 7B illustrates a case where an error occurs in the seven-th cell $C_7$ among the first to twentieth cells 130, or a case where an error occurs in memory cells indicated by the spatial address $C_7$ among the memory cells of the memory cell array 140. FIG. 7C illustrates a case where an error occurs in the thirteen-th cell $C_{13}$ of the first to twentieth cells 130, or a case where an error occurs in the memory cells indicated by the spatial address $C_{13}$ among the memory cells of the memory cell array 140.

Referring to FIG. 7B, due to an error, an error rate of the first to ten-th summation signals generated by the summation circuit 150 may be 20%. Error rates of the codes of the event unit $E_{U1}$ stored in the register circuit 162 may be 10%, 10%, and 0%, respectively, based on the threshold values $S_{th}$ ($S_{th}$=4, 5, 6). The error rate generated in the summation circuit 150 may be reduced by the encoding circuit 160. Referring to FIG. 7C, due to an error, an error rate of the first to ten-th summation signals generated by the summation circuit 150 may be 50%. Error rates of the codes of the event unit $E_{U1}$ stored in the register circuit 162 may be 10%, 20%, and 20%, respectively, based on the threshold values $S_{th}$ ($S_{th}$=4, 5, 6). The error rate generated in the summation circuit 150 may be reduced by the encoding circuit 160.

Figure 8A:
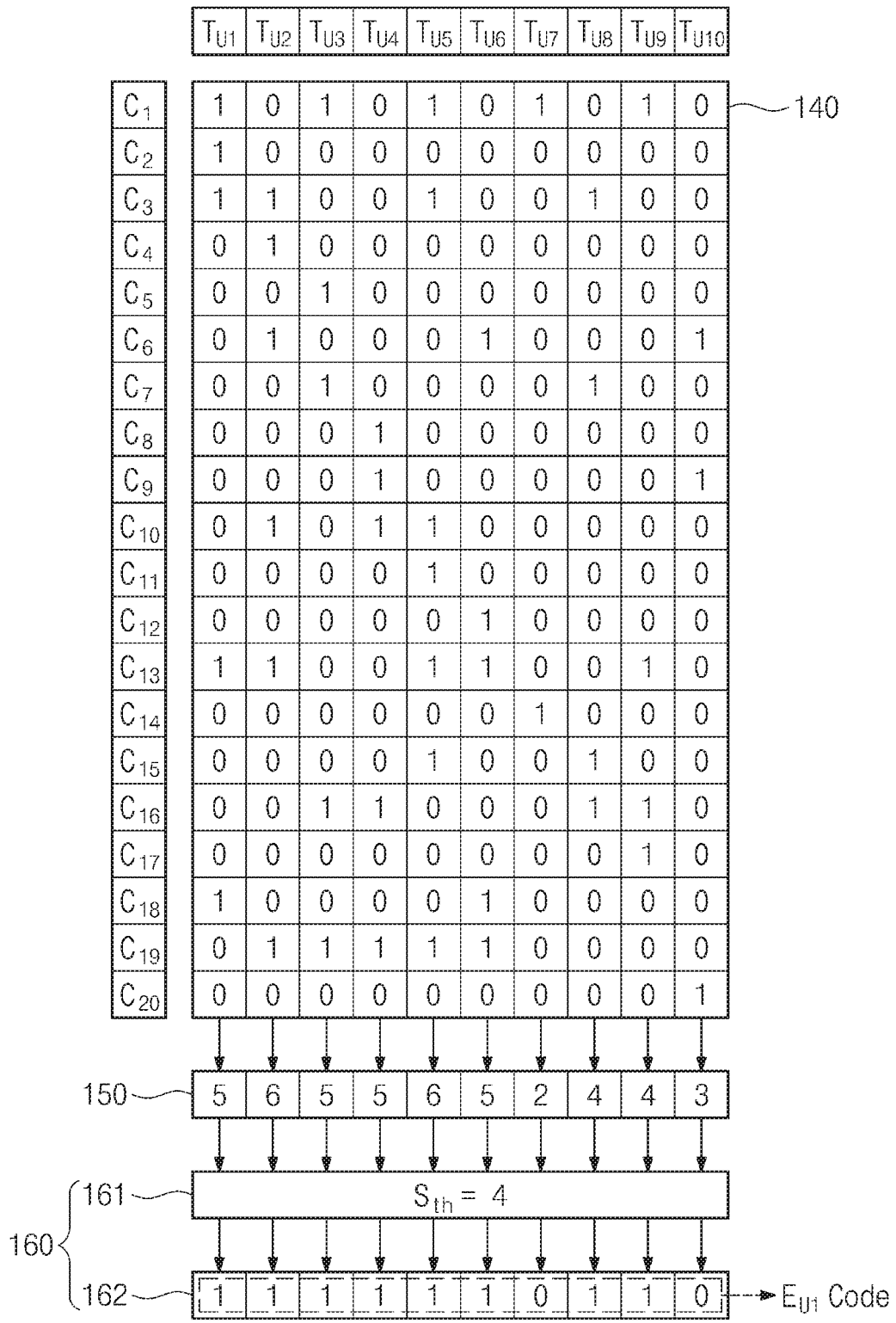
FIGS. 8A to 8C illustrate describing reliability about an error of a cell in an electronic device according to an embodiment of the inventive concept.
Figure 8B:
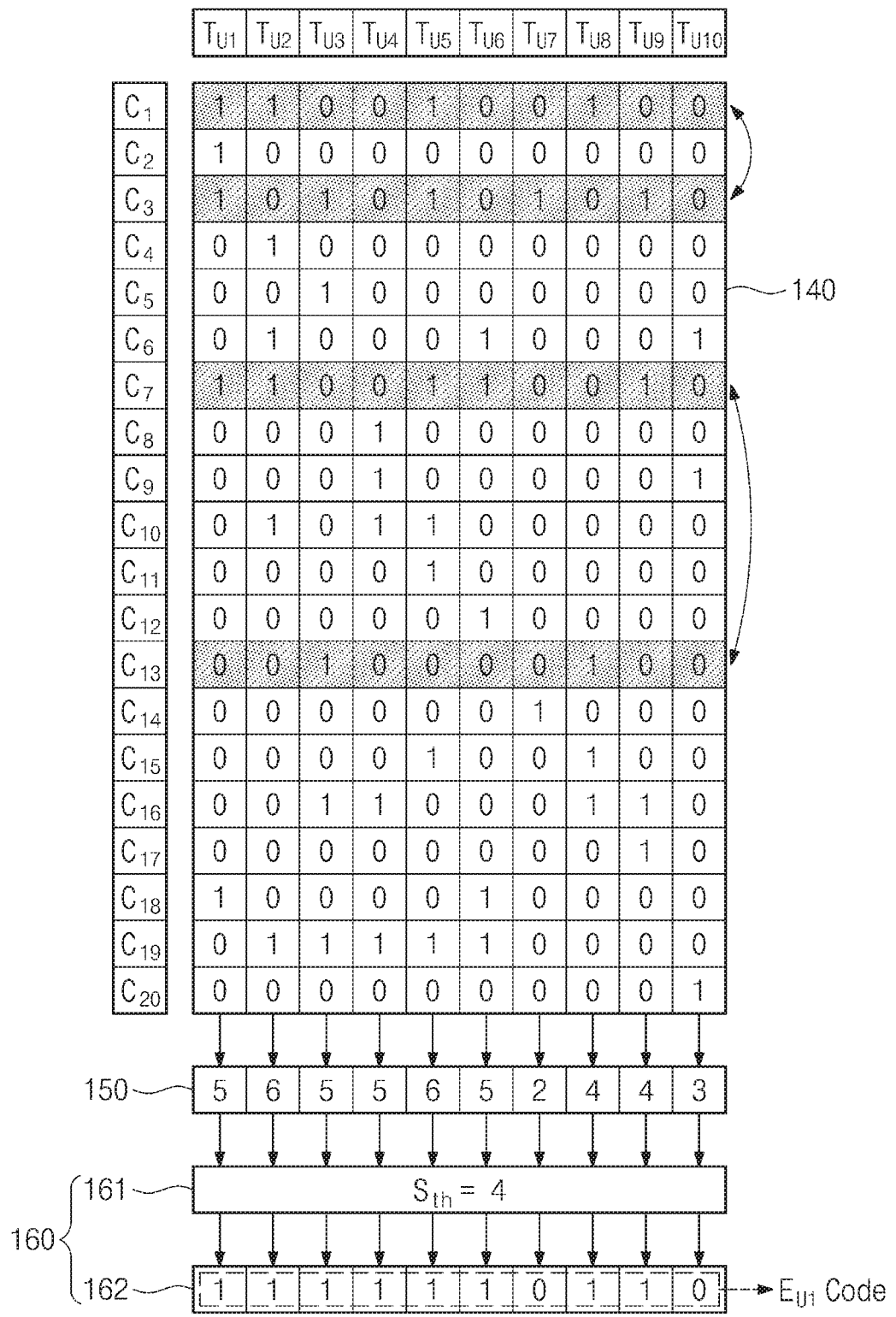
Figure 8C:
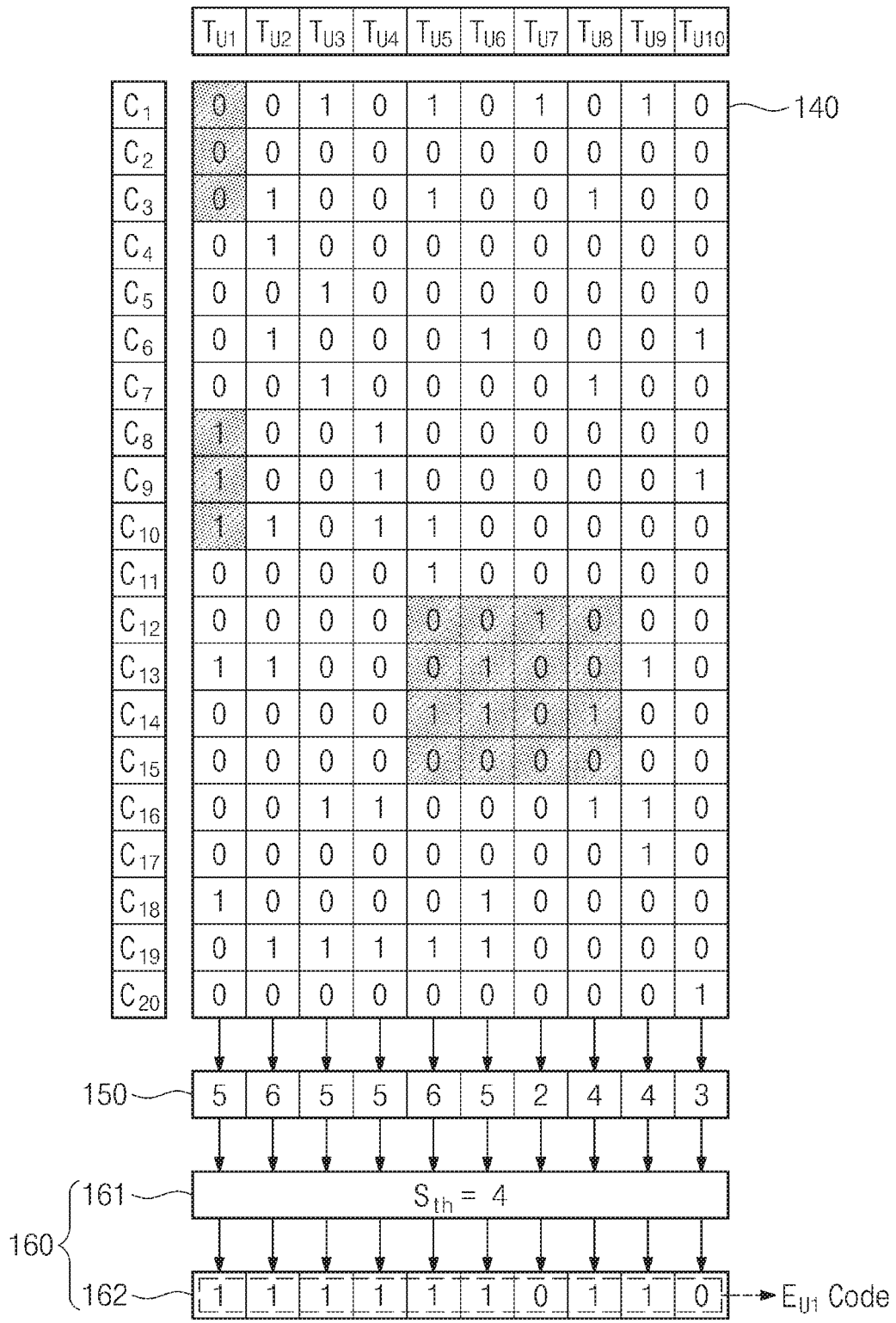

FIGS. 8A to 8C are diagrams describing reliability about an error of a cell in an electronic device according to an embodiment of the inventive concept. FIGS. 8A to 8C will be described with reference to FIGS. 5, 6A, and 6B. Each of FIGS. 8A to 8C illustrates the memory cell array 140, the summation circuit 150, and the encoding circuit 160 including the filter circuit 161 and the register circuit 162, in the electronic device 100 in which the spatial-temporal input signals (logic values) representing the event unit $E_{U1}$ are stored. In FIGS. 8A to 8C, other components of the electronic device 100 are omitted.

FIG. 8A illustrates the memory cell array 140 in which an error is not occurred. Logic values stored in the memory cell array 140 of FIG. 8A are the same as the logic values stored in the memory cell array 140 of FIG. 6A. FIG. 8B illustrates a case in which the logic values stored in the memory cells indicated by the spatial address $C_1$ and the logic values stored in the memory cells indicated by the spatial address $C_3$ are interchanged with each other, and the logic values stored in the memory cells indicated by the spatial address $C_7$ and the logic values stored in the memory cells indicated by the spatial address $C_{13}$ are interchanged with each other (refer to shaded memory cells). FIG. 8C illustrates a case where logic values stored in the memory cells indicated by the spatial addresses $C_1$ to $C_3$ and the temporal address $T_{U1}$, logic values stored in the memory cells indicated by the spatial addresses $C_8$ to $C_{10}$ and the temporal address $T_{U1}$, and logic values stored in the memory cells indicated by the spatial addresses $C_{12}$ to $C_{15}$ and the temporal addresses $T_{U5}$ to $T_{U8}$ are changed (refer to shaded memory cells).

As in the cases of FIGS. 8B and 8C, although the logic values of some memory cells are changed, inverted, or flipped, the register circuits 162 of the encoding circuits 160 of FIGS. 8A to 8C may store the same code ({1, 1, 1, 1, 1, 1, 0, 1, 1, 0}) of the event unit $E_{U1}$. Since the codes stored in the register circuits 162 are the same, the electronic device 100 may regard the event units $E_{U1}$ of FIGS. 8A to 8C as being identical to one another, based on the same code. When the electronic device 100 determines whether any two event units are the same with each other, the electronic device 100 does not determine whether the logic values stored in the memory cell array 140 representing the two event units are the same to each other. The electronic device 100 may determine whether the code values of two event units are the same to each other. Although some of the logic values stored in the memory cell array 140 representing the two event units do not coincide with each other, when the code values of the two event units are the same, the electronic device 100 may determine that the two event units coincide with each other. The above-described determination operation of the electronic device 100 may correspond to a fact that neurons in the neural network do not necessarily fire the same pattern in the same neuron for the same event.

Figure 9A:
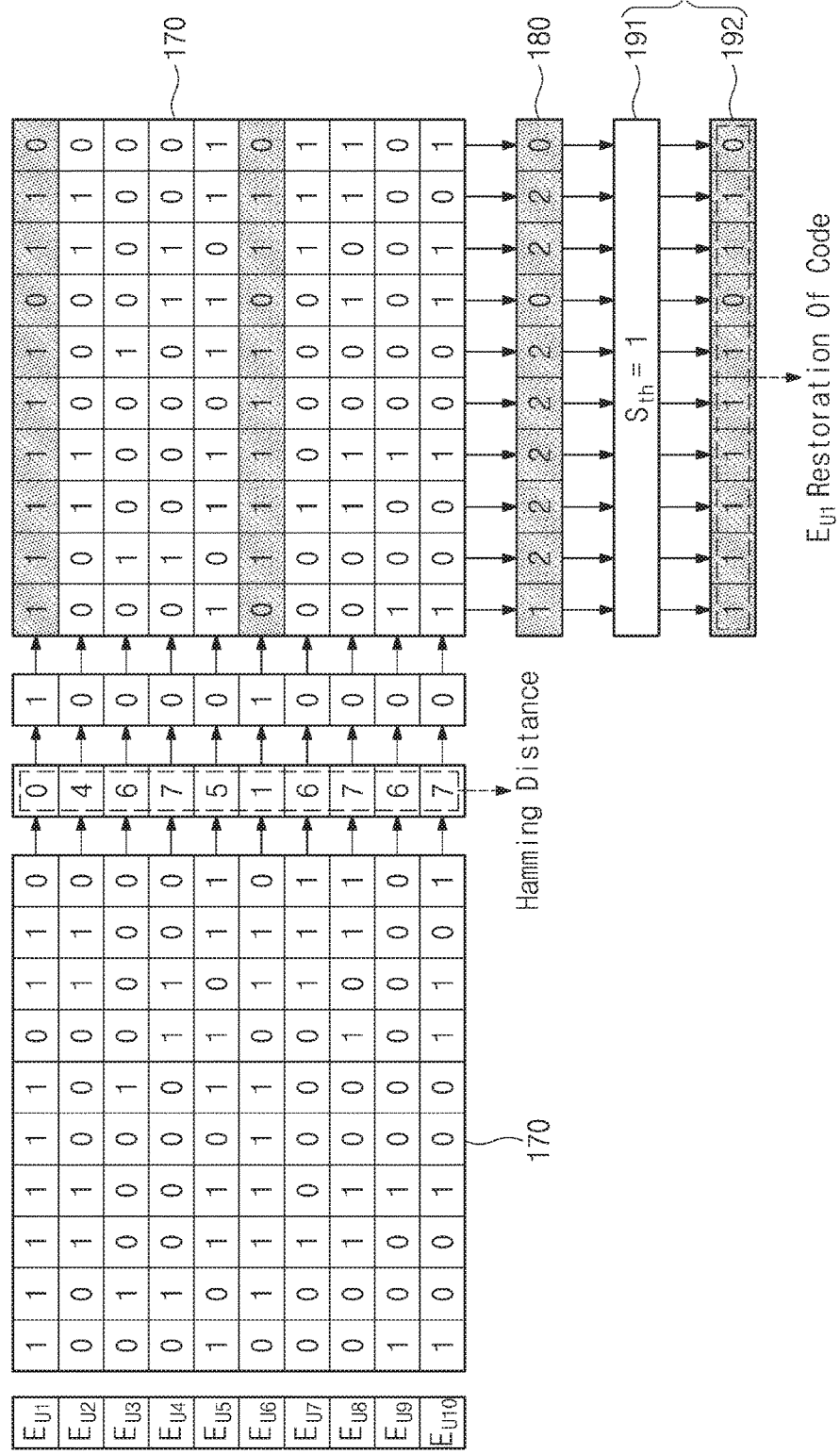
FIGS. 9A and 9B illustrate describing examples in which an electronic device according to an embodiment of the inventive concept may restore a code.
Figure 9B:
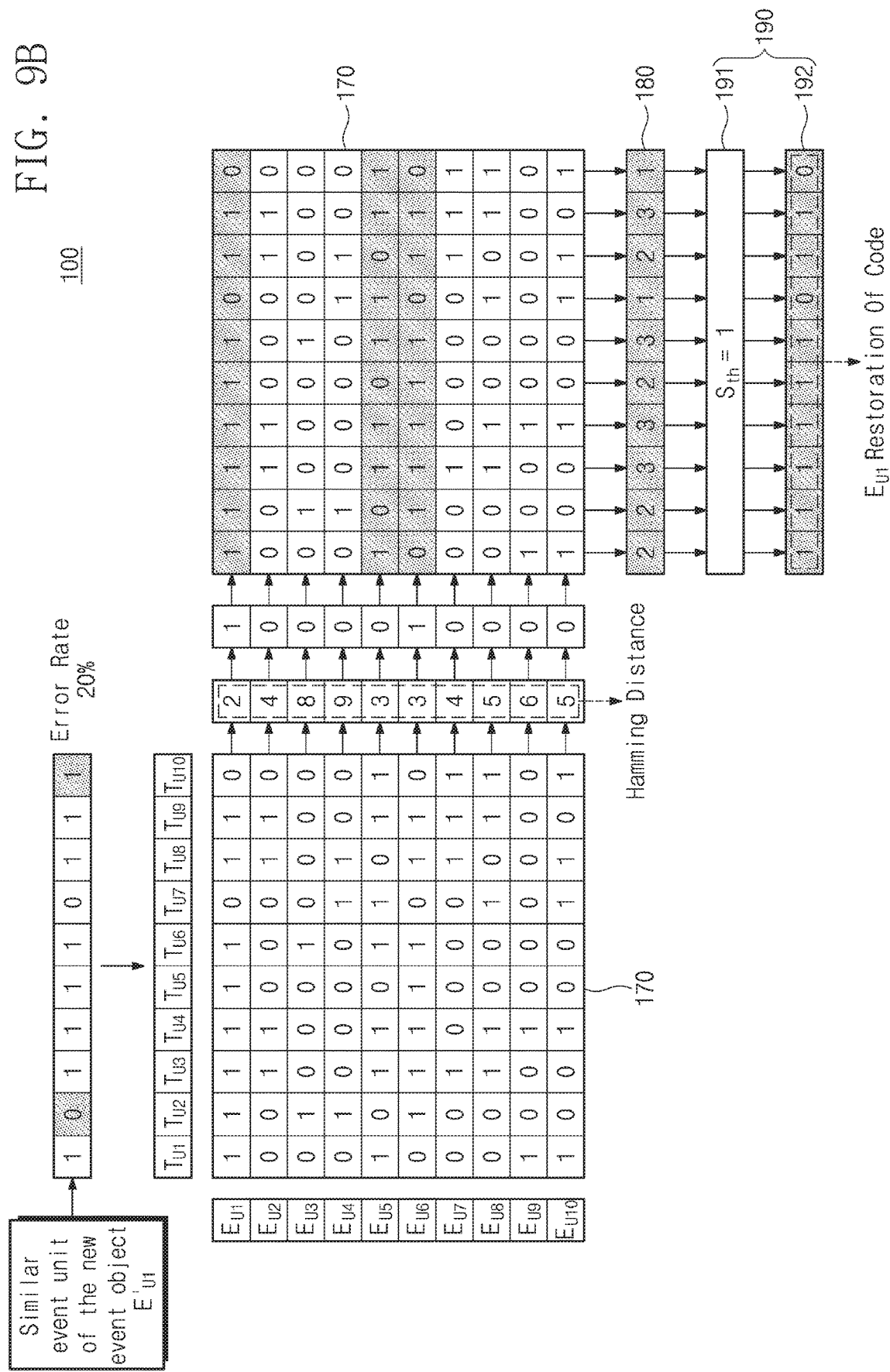

FIGS. 9A and 9B are diagrams describing examples in which an electronic device according to an embodiment of the inventive concept may restore a code. In FIGS. 9A and 9B, it is assumed that encoding of the event object $E_A$ is completed and the codes of the event units $E_{U1}$ to $E_{U10}$ configuring the event object $E_A$ are stored in the memory cell array 170 of the electronic device 100, as described above with reference to FIGS. 6A and 6B. Logic values stored in the memory cell array 170 are the same as the logic values stored in the memory cell array 170 of FIG. 6B.

The electronic device 100 may complete encoding of the event object $E_A$ and then further receive the spatial-temporal input signals indicating a new event object $E_A$. The electronic device 100 may update and store the code of the event unit $E_{U1}$ of the new event object $E_A$ in the memory cells indicated by the event unit address $E_{U1}$ among the memory cells of the memory cell array 170. In an embodiment, in FIGS. 9A and 9B, the electronic device 100 may not immediately store the code of the event unit $E_{U1}$ of the new event object $E_A$ in the memory cell array 170 to restore the code.

The summation circuit 150 and the encoding circuit 160 of the electronic device 100 may process the spatial-temporal input signals representing the event unit $E_{U1}$ of the new event object $E_A$ in the manner described above with reference to FIG. 6A to generate a code of the event unit $E_{U1}$ of the new event object $E_A$. The number of event units $E_{U1}$ to $E_{Uk}$ of the previous event object $E_A$ may be k, and the event unit $E_{U1}$ of the new event object $E_A$ will correspond to the k+1-th.

Referring to 9A and 9B, the encoding circuit 160 of the electronic device 100 may compare the code of the event unit $E_{U1}$ of the new event object $E_A$ with each of the codes of the event units $E_{U1}$ to $E_{U10}$ configuring the previous event object $E_A$ in which encoding is completed. Referring to FIG. 9A, the code of the event unit $E_{U1}$ is {1, 1, 1, 1, 1, 1, 0, 1, 1, 0}, and this may match the code of the event unit $E_{U1}$ of the previous event object $E_A$. Referring to FIG. 9B, the code of the event unit $E_{U1}$ is {1, 0, 1, 1, 1, 1, 0, 1, 1, 1}, and this is similar to the code of the event unit $E_{U1}$ of the previous event object $E_A$ but may not match. The error rate of the code of the event unit $E_{U1}$ may be 20%.

The encoding circuit 160 may calculate differences (i.e., hamming distances) between the code of the event unit $E_{U1}$ of the new event object $E_A$ and the codes of the event units $E_{U1}$ to $E_{U10}$ configuring the previous event object $E_A$ in which encoding is completed. The electronic device 100 may further include a memory cell array or registers that store the hamming distances, respectively. The electronic device 100 may compare the hamming distances with a radius and select codes of event units having hamming distances equal to or less than (or less than) the radius. The electronic device 100 may further include a memory cell array or registers that store comparison results (the first logic value or the second logic value) between the hamming distances and the radius, respectively.

In FIGS. 9A and 9B, it is assumed that the radius is 3. Referring to FIG. 9A, the encoding circuit 160 may select codes of event units $E_{U1}$ and $E_{U6}$ configuring the previous event object $E_A$ (refer to shading). The summation circuit 180 may sum the codes of the selected event units $E_{U1}$ and $E_{U6}$ for each of the first to ten-th unit times $T_{U1}$ to $T_{U10}$ to generate the first to ten-th summation signals. Referring to FIG. 9B, the encoding circuit 160 may select codes of event units $E_{U1}$, $E_{U5}$, and $E_{U6}$ configuring the previous event object $E_A$ (refer to shading). The summation circuit 180 may sum the codes of the selected event units $E_{U1}$, $E_{U5}$, and $E_{U6}$ for each of the first to ten-th unit times $T_{U1}$ to $T_{U10}$ to generate the first to ten-th summation signals.

The filter circuit 191 of the encoding circuit 190 may compare the first to ten-th summation signals with the threshold value $S_{th}(S_{th}=1)$, respectively, and output a comparison result. The register circuit 192 may store comparison results of the filter circuit 191, respectively. The values in the register circuit 192 of FIG. 9A may correspond to a result of restoring the code of the same event unit $E_{U1}$ of the new event object $E_A$. The values in the register circuit 192 of FIG. 9B may correspond to a result of restoring the code of the similar event unit $E_{U1}$ of the new event object $E_A$.

Figure 10:
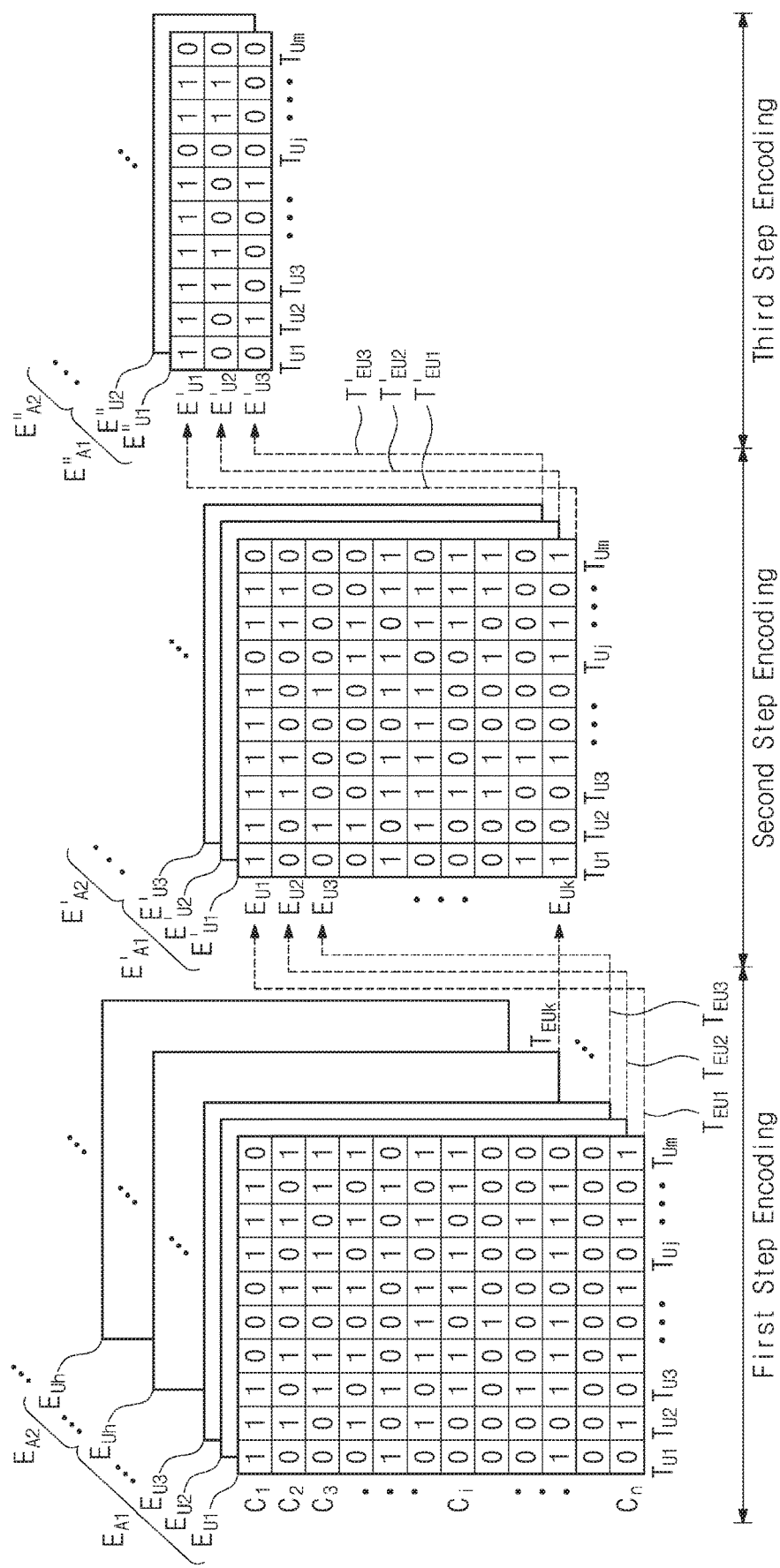
FIG. 10 illustrates describing an operation of hierarchically encoding consecutive event objects by an electronic device according to an embodiment of the inventive concept.

FIG. 10 is a diagram describing an operation of hierarchically encoding consecutive event objects by an electronic device according to an embodiment of the inventive concept. The electronic device 100 may consecutively receive the spatial-temporal input signals representing one or more event objects. Consecutive event objects may be referred to as a consecutive event. The consecutive event may be divided into one or more event objects $E_{A1}, E_{A2}, \ldots$, using the elapsed time of event object $T\_E_A$. Each of the event objects $E_{A1}, E_{A2}, \ldots$ may be divided into one or more event units $E_{U1}, \ldots, E_{Uk}$. A first step encoding process of FIG. 10 is similar to the encoding process of the event object $E_A$ described above with reference to FIGS. 6A and 6B. An encoding result of the event object $E_{A1}$ of n×m×k may be stored in a memory cell array of k×m in a second step.

Event units $E'_{U1}, E'_{U2}, E'_{U3}$ stored in a plurality of k×m memory cell arrays generated through the first step encoding process may configure event objects $E'_{A1}, E'_{A2}, \ldots$ in the second step. A second step encoding process of FIG. 10 is similar to the encoding process of the event object $E_A$ described above with reference to FIGS. 6A and 6B. An encoding result of the event object $E'_{A1}$ of k×m×3 may be stored in a 3×m memory cell array in a third step. The logic values, the number of the event units, the number of the event objects, the number of the consecutive events, and the number of steps are not limited to those illustrated in FIG. 10.

The electronic device 100 according to an embodiment of the inventive concept may perform an encoding operation capable of applying both spatial information and temporal information included in the spatial-temporal input signals. The electronic device 100 may have a strong resilience against an error occurring at an input terminal of the neural network or noise induced from the neural network.

The contents described above are specific embodiments for implementing the inventive concept. The inventive concept may include not only the embodiments described above but also embodiments in which a design is simply or easily capable of being changed. In addition, the inventive concept may also include technologies easily changed to be implemented using embodiments. Therefore, the scope of the inventive concept is not limited to the described embodiments but should be defined by the claims and their equivalents.

What is claimed is:

1. An electronic device comprising:
   first to n-th cells ('n' is an integer of 2 or more) configured to receive spatial-temporal input signals that indicate an event unit in a time window;
   a summation circuit configured to sum first to n-th cell signals recorded in the first to n-th cells for each of first to m-th unit times ('m' is an integer of 2 or more) dividing the time window to generate first to m-th summation signals;
   a sensor configured to receive spike signals;
   a conversion circuit configured to convert the spike signals into the spatial-temporal input signals;
   an encoding circuit configured to compare each of the first to m-th summation signals with a threshold value to encode the spatial-temporal input signals into a code of the event unit; and
   a memory cell array configured to store the code and output a final code to a neural network or other electronic device to model a neuron of the neural network.

2. The electronic device of claim 1, wherein the code of the event unit is a one-dimensional array of 1×m.

3. The electronic device of claim 1, wherein addresses of the first to n-th cells indicate spatial information of the spatial-temporal input signals, and
   wherein the first to m-th unit times indicate temporal information of the spatial-temporal input signals.

4. The electronic device of claim 1, wherein the first to n-th cells are further configured to receive spatial-temporal input signals in second to k-th time windows ('k' is an integer of 2 or more) after a first time window that is the time window,
   wherein the spatial-temporal input signals in the first time window indicate the event unit that is a first event unit,
   wherein the spatial-temporal input signals in the second to k-th time windows indicate second to k-th event units, respectively, and
   wherein the first to k-th event units indicate one event object.

5. The electronic device of claim 4, wherein the summation circuit is further configured to:
   sum the first to n-th cell signals recorded in the first to n-th cells for each of the first to m-th unit times dividing the second time window to generate first to m-th summation signals of the second event unit; and
   sum the first to n-th cell signals recorded in the first to n-th cells for each of the first to m-th unit times dividing the k-th time window to generate first to m-th summation signals of the k-th event unit.

6. The electronic device of claim 5, wherein the code is a first code of the first event unit, and
   wherein the encoding circuit is further configured to:
   compare each of the first to m-th summation signals of the second event unit with the threshold value to encode the spatial-temporal input signals of the second event unit into a second code of the second event unit; and
   compare each of the first to m-th summation signals of the k-th event unit with the threshold value to encode the spatial-temporal input signals of the k-th event unit into k-th code of the k-th event unit.

7. The electronic device of claim 6, wherein the encoding circuit is further configured to store the first to k-th codes in a memory cell array of k×m.

8. The electronic device of claim 7, wherein the encoding circuit is further configured to store the first to k-th codes in the memory cell array of k×m,
- wherein the first to n-th cells are further configured to receive spatial-temporal input signals that indicate a k+1-th event unit in a k+1-th time window after the k-th time window, and
- wherein the summation circuit is further configured to sum the first to n-th cell signals recorded in the first to n-th cells for each of the first to m-th unit times dividing the k+1-th time window to generate first to m-th summation signals of the k+1-th event unit.

9. The electronic device of claim 8, wherein the encoding circuit is further configured to:
- compare each of the first to m-th summation signals of the k+1-th event unit with the threshold value to encode the spatial-temporal input signals of the k+1-th event unit into a k+1-th code of the k+1-th event unit;
- select codes of the first to k-th codes, based on differences between the k+1-th code and the first to k-th codes; and
- sum the selected codes to restore the k+1-th code.

10. The electronic device of claim 6, wherein the summation circuit is a first summation circuit and the encoding circuit is a first encoding circuit, and
the electronic device further comprises:
- a second summation circuit configured to sum the first to k-th codes for each of the first to m-th unit times dividing each of the first to k-th time windows to generate first to m-th summation signals of the event object; and
- a second encoding circuit configured to compare each of the first to m-th summation signals of the event object with the threshold value to encode the event object into a final code.

11. The electronic device of claim 10, wherein the final code of the event object is a one-dimensional array of 1×m.

12. A method of operating an electronic device that encodes an event object indicated by spatial-temporal input signals, the method comprising:
- dividing the event object into first to k-th event units based on first to k-th time windows ('k' is an integer of 2 or more);
- generating first to m-th summation signals of each of the first to k-th event units by summing first to n-th cell signals recorded in first to n-th cells ('n' is an integer of 2 or more) that receive the spatial-temporal input signals for each of first to m-th unit times ('m' is an integer of 2 or more) dividing each of the first to k-th time windows;
- encoding the spatial-temporal input signals into first to k-th codes of the first to k-th event units by comparing each of the first to m-th summation signals with a threshold value;
- storing the first to k-th codes in a memory cell array; and
- outputting a final code to a neural network or other electronic device to model a neuron of the neural network;
- wherein the dividing of the event object into the first to k-th event units includes converting spike signals into the spatial-temporal input signals.

13. The method of claim 12, wherein a size of the memory cell array in which the first to k-th codes are stored is k×m.

14. The method of claim 12, wherein the event object is stored in a memory cell array of n×m×k that is distinct from the memory cell array.

15. The method of claim 12, wherein each of the first to k-th event units of the event object is stored in an n×m memory cell array that is distinct from the memory cell array.

16. The method of claim 12, wherein the spatial-temporal input signals are digital signals.

17. The method of claim 12, further comprising:
- generating first to m-th summation signals of the event object by summing the first to k-th codes for each of the first to m-th unit times;
- encoding the event object into the final code by comparing each of the first to m-th summation signals of the event object with a threshold value; and
- storing the final code in the memory cell array.

18. The method of claim 17, wherein the final code is a one-dimensional array of 1×m.

* * * * *